United States Patent
Miyake

(10) Patent No.: US 10,199,408 B2
(45) Date of Patent: Feb. 5, 2019

(54) IMAGING DEVICE INCLUDING FIRST AND SECOND PIXELS

(71) Applicant: Panasonic Intellectual Property Management Co., Ltd., Osaka (JP)

(72) Inventor: Yasuo Miyake, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/166,134

(22) Filed: May 26, 2016

(65) Prior Publication Data

US 2016/0360134 A1 Dec. 8, 2016

(30) Foreign Application Priority Data

Jun. 8, 2015 (JP) ................................. 2015-115746

(51) Int. Cl.
*H01L 27/146* (2006.01)
*H04N 5/355* (2011.01)

(52) U.S. Cl.
CPC .. *H01L 27/14603* (2013.01); *H01L 27/14621* (2013.01); *H01L 27/14636* (2013.01); *H01L 27/14638* (2013.01); *H01L 27/14665* (2013.01); *H04N 5/35563* (2013.01)

(58) Field of Classification Search
CPC ......... H01L 27/14603; H01L 27/14665; H01L 27/14636; H01L 27/14621; H01L 27/14638; H01L 27/14667; H01L 27/14669; H01L 27/1467; H01L 27/14676; H01L 27/14672; H01L 27/14674; H04N 5/35563; H04N 5/355–5/3559
See application file for complete search history.

(56) References Cited

U.S. PATENT DOCUMENTS

| | | | |
|---|---|---|---|
| 6,831,692 B1 | 12/2004 | Oda | |
| 2002/0121605 A1* | 9/2002 | Fink | H01J 31/48 250/370.08 |
| 2004/0017497 A1 | 1/2004 | Suzuki et al. | |
| 2005/0225655 A1 | 10/2005 | Suzuki | |

(Continued)

FOREIGN PATENT DOCUMENTS

| | | |
|---|---|---|
| JP | 5-267632 | 10/1993 |
| JP | 2000-125209 | 4/2000 |

(Continued)

*Primary Examiner* — Albert H Cutler
(74) *Attorney, Agent, or Firm* — McDermott Will & Emery LLP

(57) ABSTRACT

An imaging device includes: a first pixel cell including a first photoelectric conversion film having a first surface and a second surface opposite to the first surface, a first electrode on the first surface, a second electrode on the first surface, surrounding the first electrode, and a first counter electrode on the second surface, facing the first electrode and the second electrode; and a second pixel cell including a second photoelectric conversion film having a third surface and a fourth surface opposite to the third surface, a third electrode on the third surface, a fourth electrode on the third surface, surrounding the third electrode, and a second counter electrode on the fourth surface, facing the third electrode and the fourth electrode, wherein the second electrode and the fourth electrode are electrically separated from each other.

16 Claims, 23 Drawing Sheets

(56) References Cited

U.S. PATENT DOCUMENTS

| | | | |
|---|---|---|---|
| 2007/0164333 A1* | 7/2007 | Wright | H01L 27/12 257/292 |
| 2009/0085080 A1 | 4/2009 | Han | |
| 2009/0127599 A1* | 5/2009 | Kim | H01L 27/14634 257/292 |
| 2011/0156114 A1* | 6/2011 | Park | H01L 27/14603 257/294 |
| 2012/0086095 A1 | 4/2012 | Nishiyama et al. | |
| 2014/0117486 A1* | 5/2014 | Doi | H01L 27/14665 257/448 |
| 2016/0035921 A1* | 2/2016 | Matsuda | H01L 27/14645 348/374 |
| 2016/0037098 A1* | 2/2016 | Lee | H01L 27/307 257/40 |

FOREIGN PATENT DOCUMENTS

| | | |
|---|---|---|
| JP | 2005-286104 A | 10/2005 |
| JP | 2008-016862 | 1/2008 |
| JP | 2009-08851 A | 4/2009 |
| WO | 2007/122890 | 11/2007 |
| WO | 2010/116974 A1 | 10/2010 |

\* cited by examiner

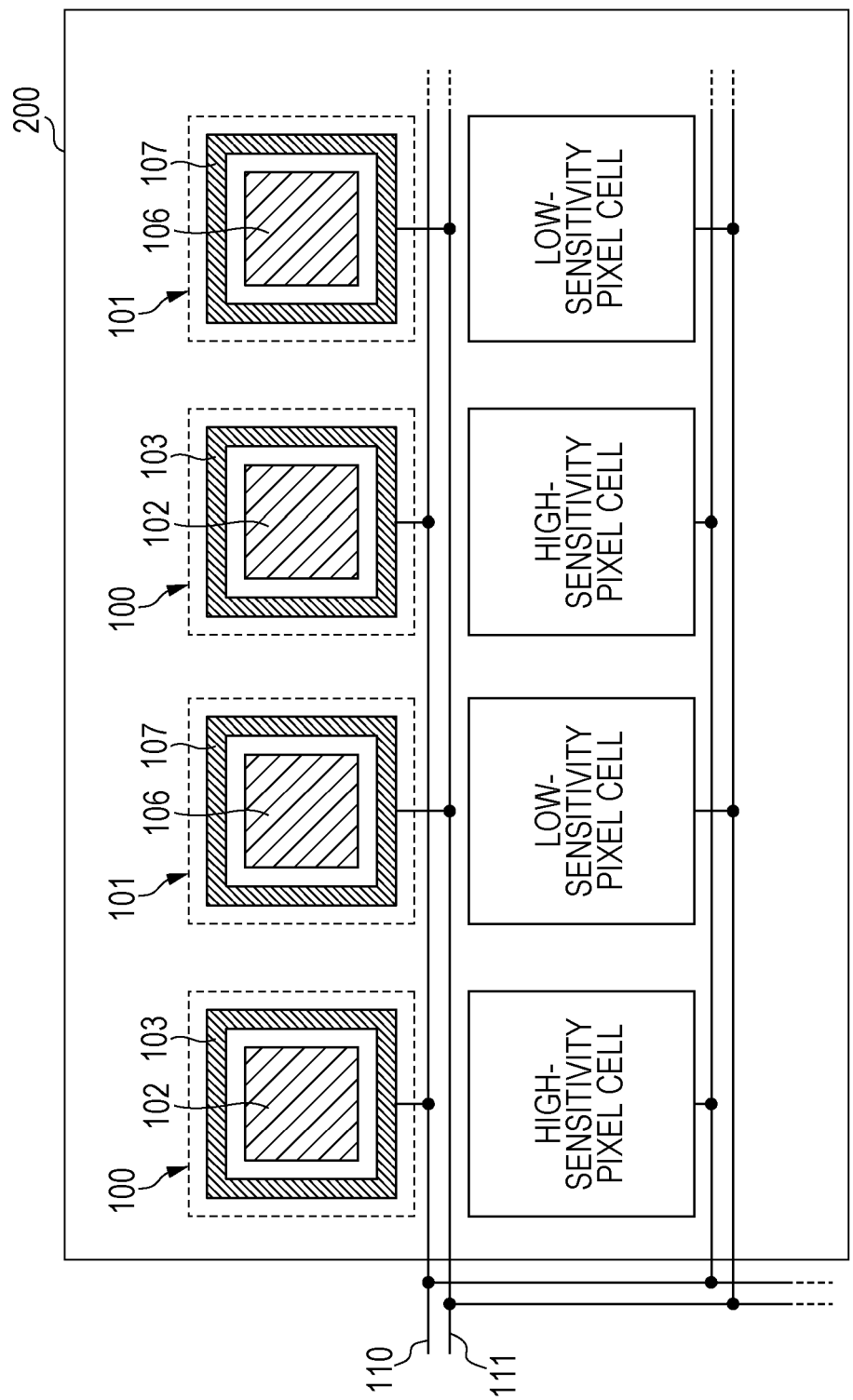

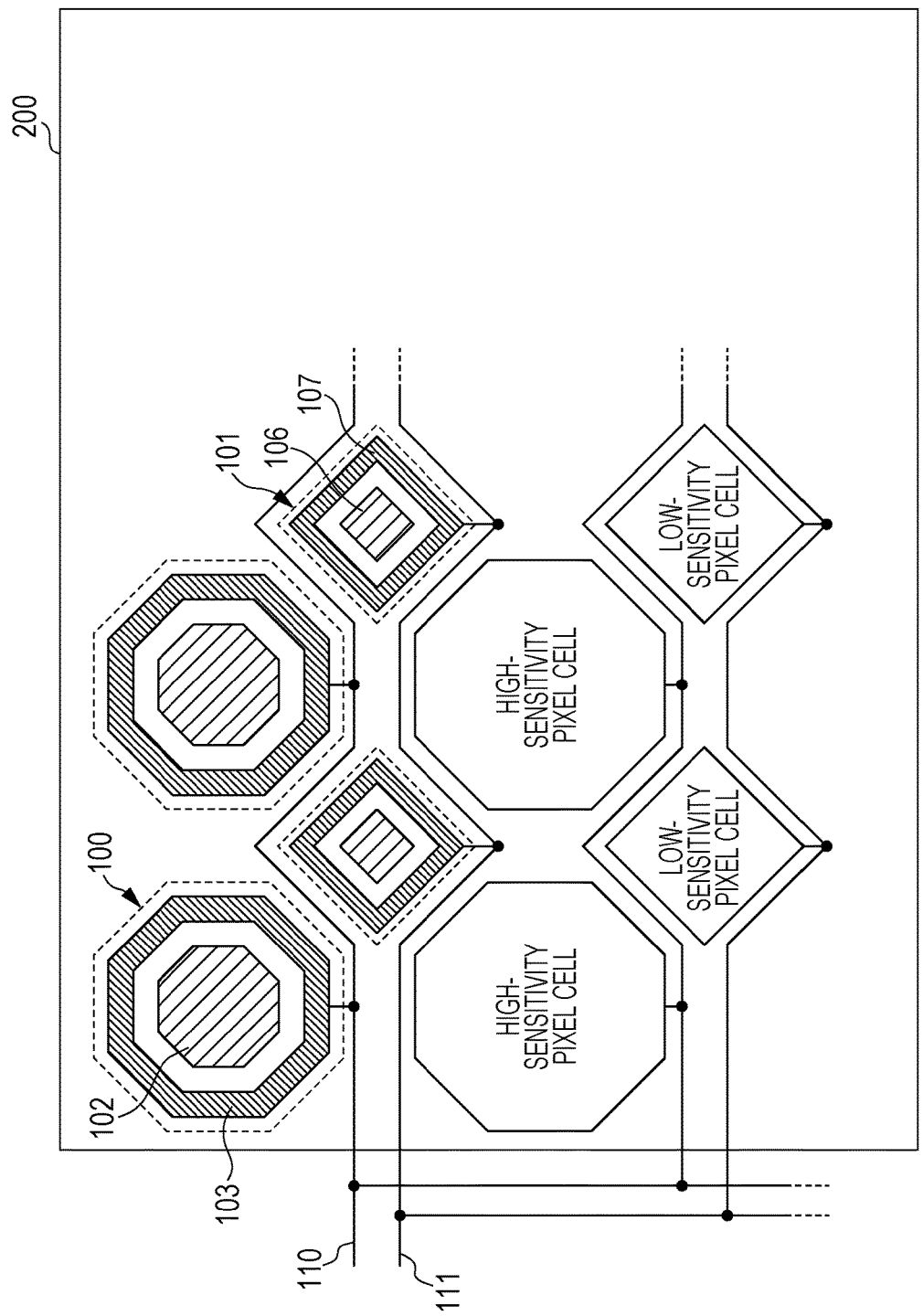

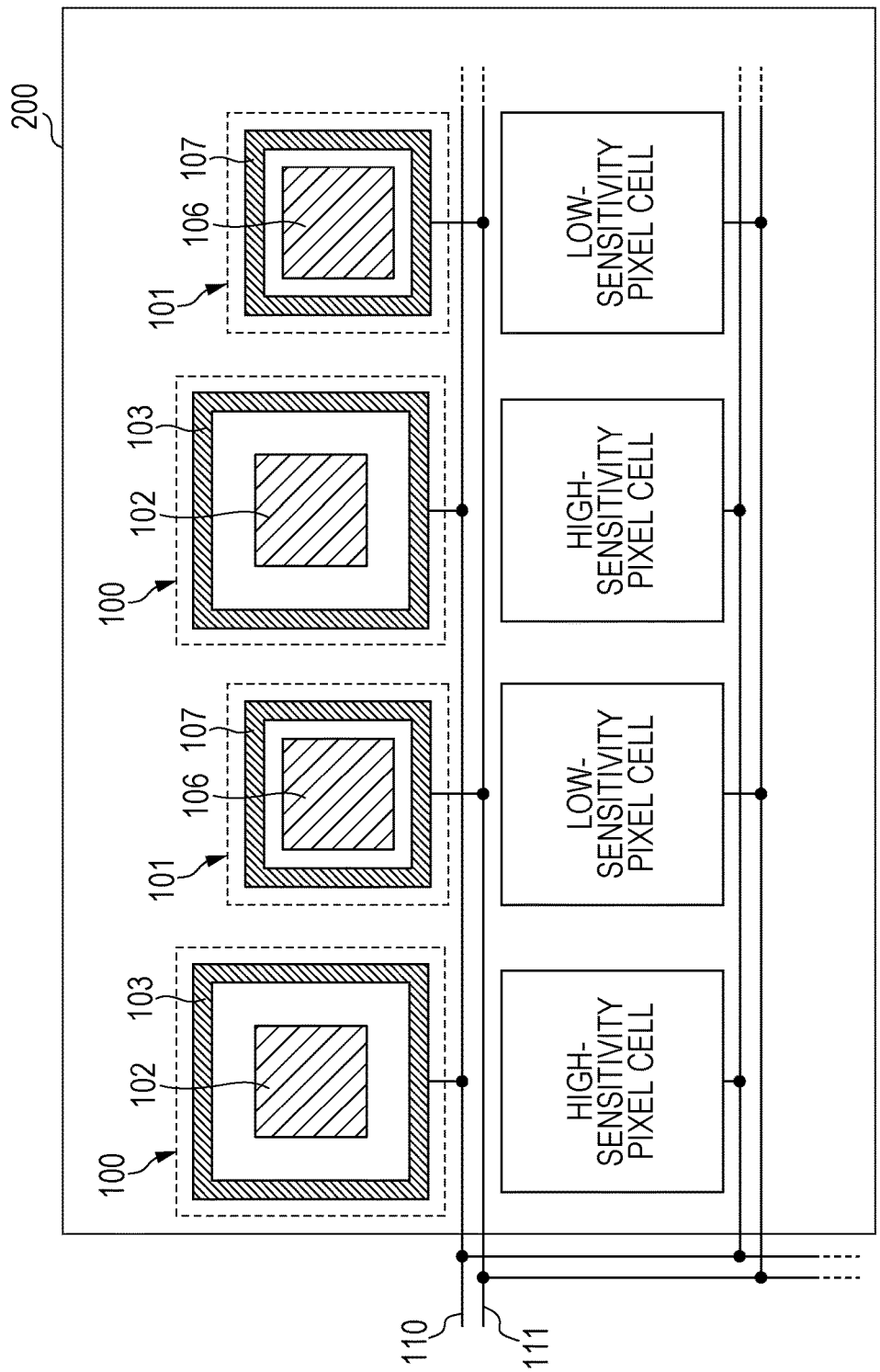

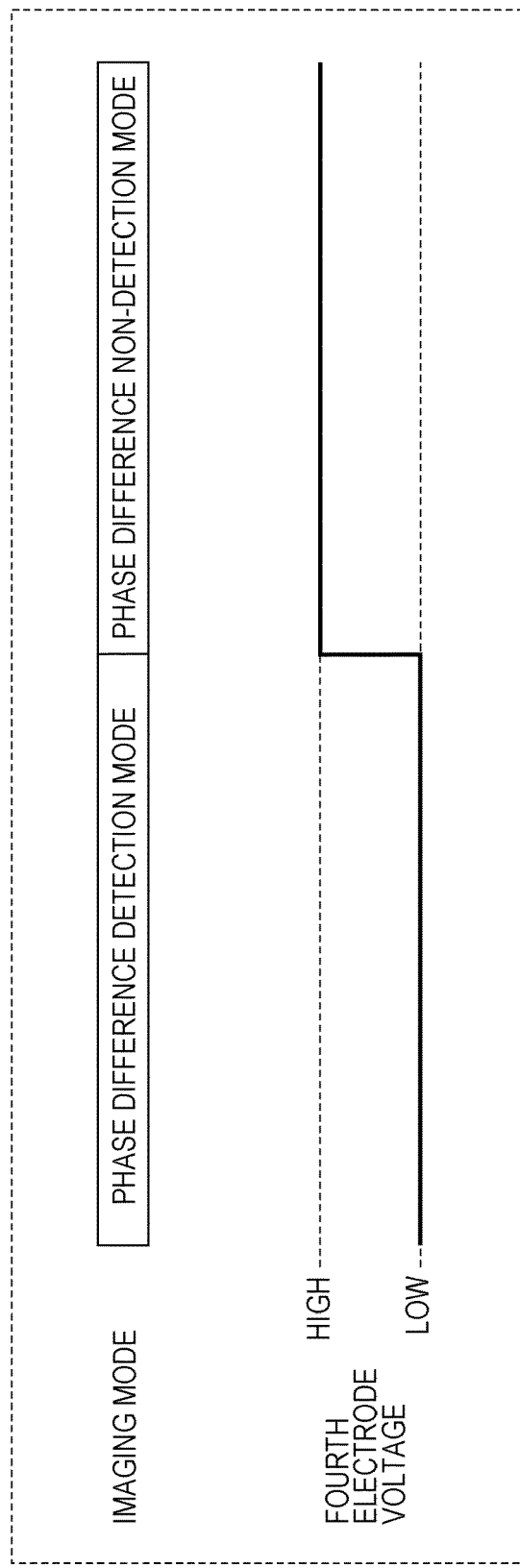

IMAGING DEVICE INCLUDING FIRST AND SECOND PIXELS

BACKGROUND

1. Technical Field

The present disclosure relates to imaging devices and imaging modules.

2. Description of the Related Art

In recent years, a technique of expanding the dynamic range by disposing high-sensitivity pixel cells and low-sensitivity pixel cells in an imaging region in imaging devices such as a charge coupled device (CCD) image sensor and a complementary MOS (CMOS) image sensor has been proposed. For example, Japanese Patent No. 4018820 discloses an imaging device that can expand the dynamic range. In this imaging device, a large area photodiode is disposed in a high-sensitivity pixel cell and a small area photodiode is disposed in a low-sensitivity pixel cell.

SUMMARY

One non-limiting and exemplary embodiment provides an imaging device that is capable of wide dynamic range shooting.

In one general aspect, the techniques disclosed here feature an imaging device including: a first pixel cell including a first photoelectric conversion film having a first surface and a second surface opposite to the first surface, a first electrode on the first surface, a second electrode on the first surface, surrounding the first electrode, and a first counter electrode on the second surface, facing the first electrode and the second electrode; and a second pixel cell including a second photoelectric conversion film having a third surface and a fourth surface opposite to the third surface, a third electrode on the third surface, a fourth electrode on the third surface, surrounding the third electrode, and a second counter electrode on the fourth surface, facing the third electrode and the fourth electrode, wherein the second electrode and the fourth electrode are electrically separated from each other.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a schematic diagram depicting the electrical connection relationship between the second electrodes of the first pixel cells and the fourth electrodes of the second pixel cells;

FIG. 7 is a schematic diagram depicting a layout example of the first pixel cells and the second pixel cells having the shapes depicted in FIGS. 6A to 6D in an imaging region;

FIG. 9 is a schematic diagram depicting a layout example of the first pixel cell depicted in FIG. 8A and the second pixel cell depicted in FIG. 8B;

FIG. 12 is a diagram indicating switching timing of an applied voltage at the time of phase difference detection;

DETAILED DESCRIPTION

Figure 1:
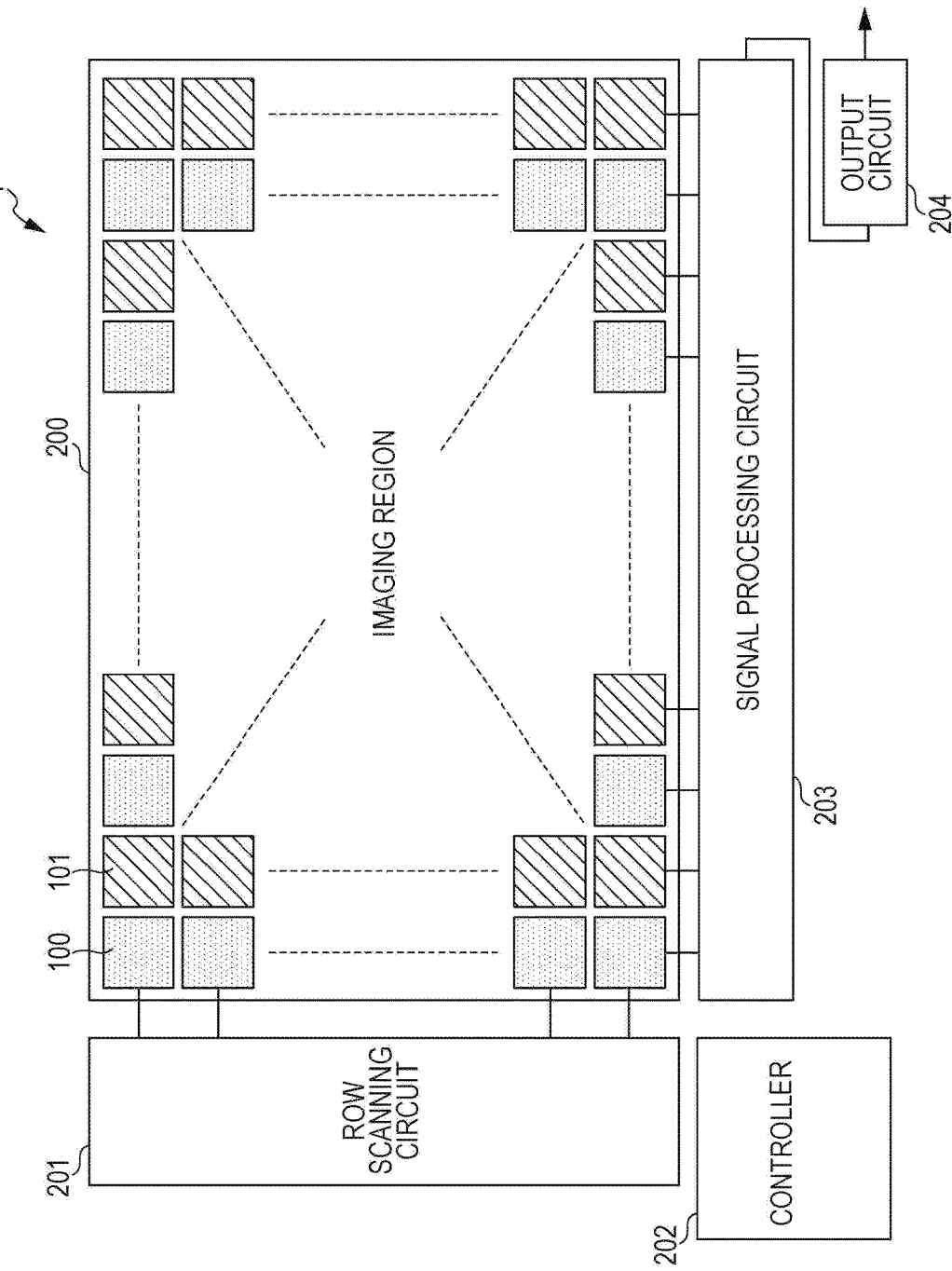
FIG. 1 is a schematic diagram depicting an exemplary configuration of an imaging device according to a first embodiment.

The present disclosure includes an imaging device and an imaging module which are described in the following items.

[Item 1]

An imaging device including: a first pixel cell including a first photoelectric conversion film having a first surface and a second surface opposite to the first surface, a first electrode on the first surface, a second electrode on the first surface, surrounding the first electrode, and a first counter electrode on the second surface, facing the first electrode and the second electrode; and a second pixel cell including a second photoelectric conversion film having a third surface and a fourth surface opposite to the third surface, a third electrode on the third surface, a fourth electrode on the third surface, surrounding the third electrode, and a second counter electrode on the fourth surface, facing the third electrode and the fourth electrode, wherein the second electrode and the fourth electrode are electrically separated from each other.

With the imaging device described in Item 1, it is possible to apply separate voltages to the second electrode and the fourth electrode. Additionally since the capacity of the second electrode and the capacity of the fourth electrode are reduced as compared to a case in which the second electrode and the fourth electrode are electrically connected, it is possible to vary the voltage which is applied to each of the second electrode and the fourth electrode at high speed.

[Item 2]

The imaging device described in Item 1, wherein an area of the first electrode is larger than an area of the third electrode.

With the imaging device described in Item 2, a plurality of first pixel cells function as high-sensitivity pixel cells and a plurality of second pixel cells function as low-sensitivity pixel cells. Since the sensitivity of the plurality of first pixel cells becomes higher than the sensitivity of the plurality of second pixel cells, it is possible to expand the dynamic range.

[Item 3]

The imaging device described in Item 1, wherein a shortest distance between the first electrode and the second electrode is greater than a shortest distance between the third electrode and the fourth electrode.

With the imaging device described in Item 3, a plurality of first pixel cells function as high-sensitivity pixel cells and a plurality of second pixel cells function as low-sensitivity pixel cells. Since it is possible to suppress a reduction in sensitivity caused by the second electrode in the plurality of first pixel cells and accelerate a reduction in sensitivity caused by the fourth electrode in the plurality of second pixel cells, it is possible to expand the dynamic range.

[Item 4]

The imaging device described in any one of Items 1 to 3, further comprising a voltage supplying circuit, applying respective voltages to the second electrode and the fourth electrode independently.

With the imaging device described in Item 4, since there is no need to connect the voltage applying circuit outside, it is possible to reduce the size of an imaging module including the imaging device.

[Item 5]

The imaging device described in Item 4, wherein the voltage supplying circuit applies a first voltage to the second electrode, and the voltage supplying circuit applies a second voltage different from the first voltage, to the fourth electrode.

With the imaging device described in Item 5, since it is possible to suppress a reduction in sensitivity caused by the second electrode in the plurality of first pixel cells and accelerate a reduction in sensitivity caused by the fourth electrode in the plurality of second pixel cells, it is possible to expand the dynamic range.

[Item 6]

The imaging device described in any one of Items 1 to 5, wherein the first electrode, the second electrode, the third electrode, and the fourth electrode are arranged on a same plane.

With the imaging device described in Item 6, since it is possible to form the electrodes all together, it is possible to simplify the process and reduce production costs.

[Item 7]

The imaging device described in any one of Items 1 to 6, wherein the first photoelectric conversion film and the second photoelectric conversion film are a single film.

With the imaging device described in Item 7, since it is possible to form the photoelectric conversion films all together, it is possible to simplify the process and reduce production costs.

[Item 8]

The imaging device described in any one of Items 1 to 7, wherein the first counter electrode and the second counter electrode are a single electrode.

With the imaging device described in Item 8, since it is possible to form the counter electrodes all together, it is possible to simplify the process and reduce production costs.

[Item 9]

The imaging device described in any one of Items 1 to 8, wherein in a plan view, the second electrode has a first opening in which the first electrode is located, and in a plan view, the fourth electrode has a second opening in which the third electrode is located.

With the imaging device described in Item 9, since it is possible to expand the range of sensitivity which can be varied by the second electrode and the fourth electrode, it is possible to expand the dynamic range. Moreover, it is possible to suppress electrical coupling between the first electrode and the third electrode. Since it is possible to reduce leakage charges from the adjacent pixels, it is possible to suppress color mixing and a reduction in resolution effectively.

[Item 10]

The imaging device described in any one of Items 1 to 9, wherein the second electrode has a function different from a function of the first electrode, and the fourth electrode has a function different from a function of the third electrode.

[Item 11]

The imaging device described in Item 1, wherein a sensitivity of the first pixel cell is higher than a sensitivity of the second pixel cell.

[Item 12]

An imaging module including: the imaging device described in any one of Items 1 to 11, outputting a signal; and a signal processor generating image data by processing the signal.

With the imaging device described in Item 12, it is possible to provide an imaging module that is capable of wide dynamic range shooting by suppressing saturation of low-sensitivity pixels.

According to an aspect of the present disclosure described above, since the second electrode and the fourth electrode are electrically separated from each other, it is possible to apply separate voltages to the second electrode and the fourth electrode. For example, it is possible to control the second electrode and the fourth electrode on a pixel cell-by-pixel cell basis and it is also possible to group the plurality of first pixel cells and second pixel cells and control the pixel cells on a group-by-group basis.

Hereinafter, with reference to the drawings, embodiments of the present disclosure will be described. Incidentally, the present disclosure is not limited to the embodiments described below. Moreover, the embodiments can be changed as appropriate without departing from the scope within which the effect of the present disclosure can be obtained. Furthermore, one embodiment can be combined with another embodiment. In the following description, identical or similar component elements are identified with the same reference numerals. Moreover, overlapping explanations may be omitted.

First Embodiment

With reference to FIGS. 1 to 12, the structure and the function of an imaging device 1 according to a first embodiment will be described.

(Structure of the Imaging Device 1)

FIG. 1 schematically depicts the configuration of the imaging device 1 according to this embodiment. The imaging device 1 typically includes a plurality of first pixel cells 100 and a plurality of second pixel cells 101 which are arranged in a matrix in an imaging region 200, a row scanning circuit 201, a controller 202, a signal processing circuit 203, and an output circuit 204. Hereinafter, the plurality of first pixel cells 100 and the plurality of second pixel cells 101 (that is, the entire pixel cells in the imaging region 200) are sometimes referred to as a "plurality of pixel cells".

As depicted in FIG. 1, for example, the plurality of first pixel cells 100 are arranged in each odd-numbered column and the plurality of second pixel cells 101 are arranged in each even-numbered column. Moreover, in this embodiment, the plurality of first pixel cells 100 function as high-sensitivity pixel cells and the plurality of second pixel cells 101 function as low-sensitivity pixel cells. Incidentally, the plurality of pixel cells may be one-dimensionally arranged. In that case, the imaging device 1 may be a line sensor.

The row scanning circuit 201 is also called a vertical scanning circuit. The row scanning circuit 201 is connected to the plurality of first pixel cells 100 and the plurality of second pixel cells 101 via various control lines. The row scanning circuit 201 selects a plurality of pixel cells arranged in each row on a row-by-row basis and performs reading of a signal voltage and resetting of the potential of a pixel electrode in the pixel cell. The controller 202 controls the whole of the imaging device 1.

The signal processing circuit 203 performs signal processing of a pixel signal read from each pixel cell. Specifically, the signal processing circuit 203 performs, for example, noise suppression signal processing such as correlated double sampling, and analog-digital conversion (AD conversion).

The output circuit 204 outputs the signal processed by the signal processing circuit 203 to the outside of the imaging device 1.

(Device Structure of Each Pixel Cell)

Figure 2A:
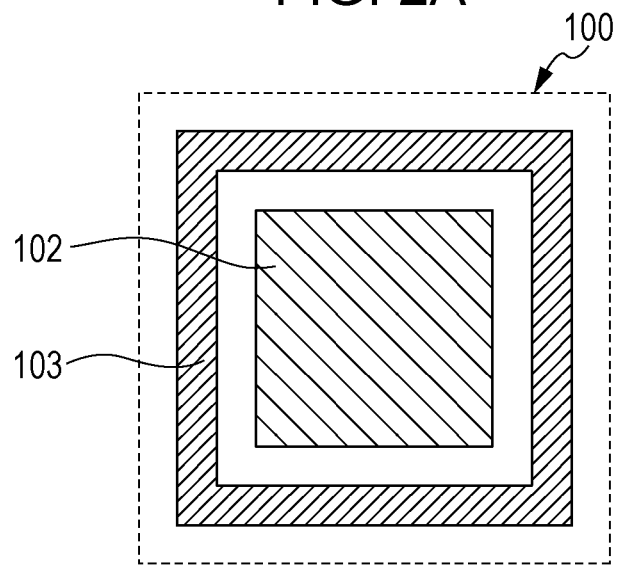
FIG. 2A is a schematic diagram depicting a layout example of a first electrode and a second electrode of a first pixel cell.
Figure 2B:
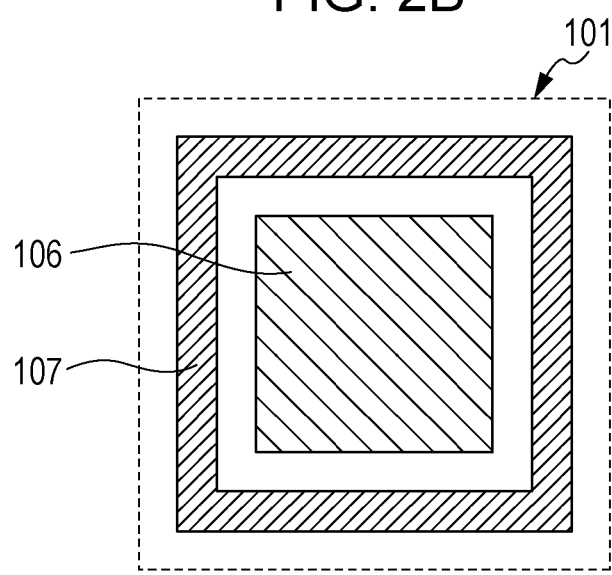
FIG. 2B is a schematic diagram depicting a layout example of a third electrode and a fourth electrode of a second pixel cell.
Figure 2C:
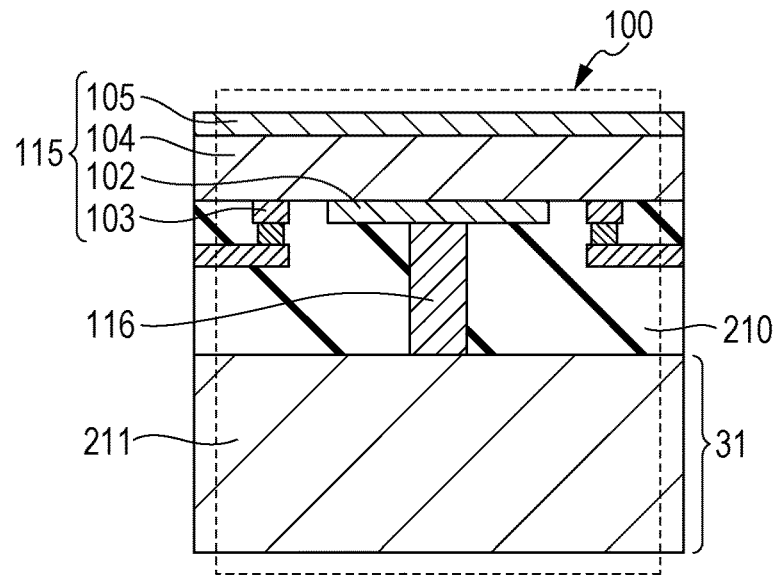
FIG. 2C is a schematic sectional view of the device structure of the first pixel cell.
Figure 2D:
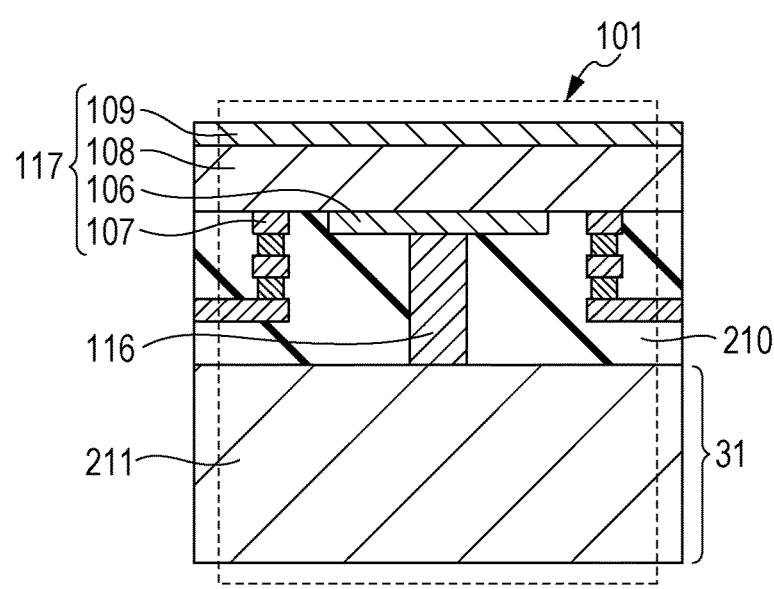
FIG. 2D is a schematic sectional view of the device structure of the second pixel cell.

FIG. 2A schematically depicts a layout example of a first electrode 102 and a second electrode 103 of each first pixel cell 100, and FIG. 2B schematically depicts a layout example of a third electrode 106 and a fourth electrode 107 of each second pixel cell 101. Moreover, FIG. 2C is a schematic sectional view of the device structure of the first pixel cell 100, and FIG. 2D is a schematic sectional view of the device structure of the second pixel cell 101.

As described earlier, the first pixel cell 100 is a high-sensitivity pixel cell. The first pixel cell 100 includes a semiconductor substrate 31, a readout circuit 211 formed in the semiconductor substrate 31, and a first photoelectric converter 115 disposed above the semiconductor substrate 31. The semiconductor substrate 31 is a p-type silicon substrate, for example. The readout circuit 211 detects a signal charge captured by the first electrode 102 and outputs a signal voltage commensurate with the signal charge. The readout circuit 211 typically includes an amplification transistor, a reset transistor, an address transistor.

On the upper surface of the semiconductor substrate 31, an interlayer insulating layer 210 is stacked. In the interlayer insulating layer 210, a contact plug 116 and various wires, which electrically connect the readout circuit 211 and the first electrode 102, are embedded.

The first photoelectric converter 115 is provided on the interlayer insulating layer 210. The first photoelectric converter 115 includes the first electrode 102, the second electrode 103, a first counter electrode 105, and a first photoelectric conversion film 104. The first photoelectric conversion film 104 is in contact with the first electrode 102 and the second electrode 103 which are provided on the interlayer insulating layer 210. On a surface of the first photoelectric conversion film 104 on the side opposite to a surface in contact with the first electrode 102 and the second electrode 103, the first counter electrode 105 is provided. The first photoelectric conversion film 104 is sandwiched between the first counter electrode 105, and the first electrode 102 and the second electrode 103.

The first counter electrode 105 is formed of, for example, a conductive transparent material such as ITO. The first electrode 102 and the second electrode 103 are formed of metal such as aluminum or copper, polysilicon which is doped with impurities and is provided with conductivity, or the like. Though not depicted in the drawing, the first pixel cell 100 may include, on the first counter electrode 105, a microlens that collects light.

As depicted in FIG. 2A, the first electrode 102 has a rectangular shape, and the second electrode 103 has a ring-like rectangular shape surrounding the first electrode 102. As described above, in this embodiment, the second electrode 103 is formed continuously in such a way as to surround the first electrode 102. That is, in a plan view, the second electrode 103 has an opening and the first electrode 102 is disposed in the opening. Moreover, the first electrode 102 and the second electrode 103 are spaced from each other by a predetermined distance.

The second pixel cell 101 depicted in FIGS. 2B and 2D is a low-sensitivity pixel cell. The second pixel cell 101 has virtually the same structure as the first pixel cell 100. Specifically, the second pixel cell 101 includes the semiconductor substrate 31, the readout circuit 211, and a second photoelectric converter 117.

On the upper surface of the semiconductor substrate 31, the interlayer insulating layer 210 is stacked. In the interlayer insulating layer 210, the contact plug 116 and various wires, which electrically connect the readout circuit 211 and the third electrode 106, are embedded.

The second photoelectric converter 117 is provided on the interlayer insulating layer 210. The second photoelectric converter 117 includes the third electrode 106, the fourth electrode 107, a second counter electrode 109, and a second photoelectric conversion film 108. The second photoelectric conversion film 108 is in contact with the third electrode 106 and the fourth electrode 107 which are provided on the interlayer insulating layer 210. On a surface of the second photoelectric conversion film 108 on the side opposite to a surface in contact with the third electrode 106 and the fourth electrode 107, the second counter electrode 109 is provided. The second photoelectric conversion film 108 is sandwiched between the second counter electrode 109, and the third electrode 106 and the fourth electrode 107. Though not depicted in the drawing, as is the case with the first pixel cell 100, the second pixel cell 101 may include, on the second counter electrode 109, a microlens that collects light.

As depicted in FIG. 2B, the third electrode 106 has a rectangular shape, and the fourth electrode 107 has a ring-like rectangular shape surrounding the third electrode 106. As described above, in this embodiment, the fourth electrode 107 is formed continuously in such a way as to surround the third electrode 106. That is, in a plan view, the fourth electrode 107 has an opening and the third electrode 106 is disposed in the opening. Moreover, the third electrode 106 and the fourth electrode 107 are spaced from each other by a predetermined distance. Incidentally, the shape of the third electrode 106 of the present disclosure is not limited to a rectangular shape; for example, the third electrode 106 may be circular or polygonal in shape.

Figure 3A:
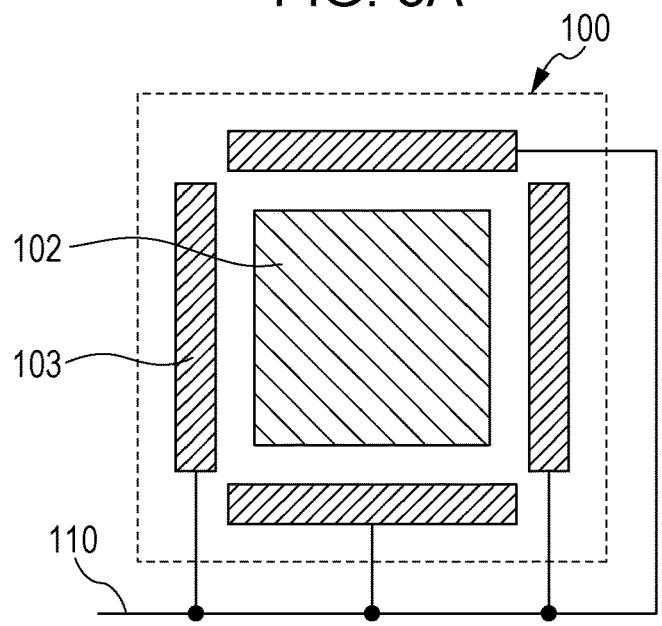
FIG. 3A is a schematic diagram depicting another layout example of the first electrode and the second electrode of the first pixel cell.
Figure 3B:
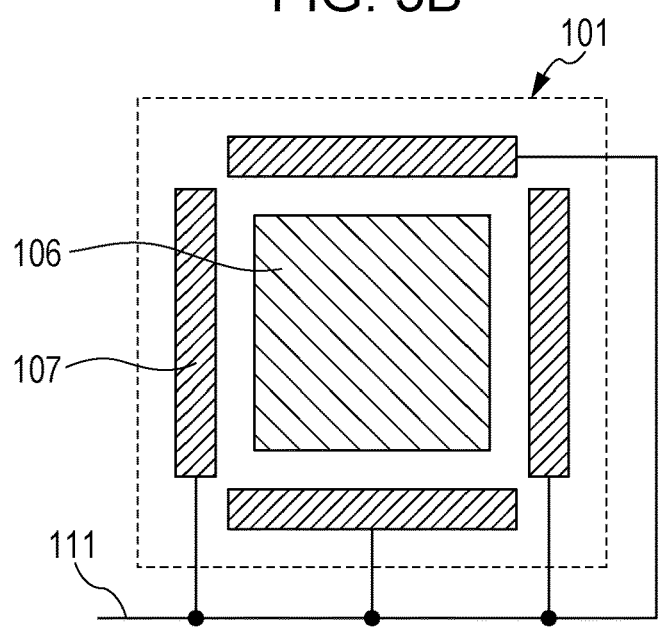
FIG. 3B is a schematic diagram depicting another layout example of the third electrode and the fourth electrode of the second pixel cell.

FIG. 3A schematically depicts another layout example of the first electrode 102 and the second electrode 103 of the first pixel cell 100, and FIG. 3B schematically depicts another layout example of the third electrode 106 and the fourth electrode 107 of the second pixel cell 101. In the present disclosure, as depicted in the drawings, the second electrode 103 may be formed discontinuously in such a way as to surround the first electrode 102. Moreover, the fourth electrode 107 may be formed discontinuously in such a way as to surround the third electrode 106. However, each of the portions of the discontinuously-formed second electrode 103 is electrically connected to a wire 110 which will be described later. Furthermore, each of the portions of the discontinuously-formed fourth electrode 107 is electrically connected to a wire 111 which will be described later.

FIG. 4 schematically depicts the electrical connection relationship between the second electrodes 103 of the first pixel cells 100 and the fourth electrodes 107 of the second pixel cells 101. In the imaging region 200, the second electrodes 103 and the fourth electrodes 107 are electrically separated from each other. The second electrodes 103 of the plurality of first pixel cells 100 are electrically connected to one another by the wire 110. Moreover, the fourth electrodes 107 of the plurality of second pixel cells 101 are electrically connected to one another by the wire 111.

Each second electrode 103 and each fourth electrode 107 function as a shielding electrode. By electrically separating the second electrode 103 and the fourth electrode 107 from each other, it is possible to apply a voltage to the second electrode 103 and the fourth electrode 107 independently. Moreover, as compared to a case in which the second electrode 103 and the fourth electrode 107 are electrically connected to each other, the capacity of each of the second electrode 103 and the fourth electrode 107 is reduced. This makes it possible to vary a voltage (that is, a shielding voltage) which is applied to each of the second electrode 103 and the fourth electrode 107 at high speed. As a result, it is possible to vary the sensitivity of the first pixel cell 100 and the sensitivity of the second pixel cell 101 independently at high speed.

Here, the principle behind variations in sensitivity will be described in detail. It is noted that, in this embodiment, the imaging device 1 detects a hole of an electron-hole pair generated in the first photoelectric conversion film 104 and the second photoelectric conversion film 108 through photoelectric conversion, as a signal charge. It goes without saying that the imaging device 1 may detect an electron as a signal charge.

The sensitivity of the first pixel cell (the high-sensitivity pixel cell) 100 varies according to an electric field generated by a potential difference between the first electrode 102 and the first counter electrode 105 and an electric field generated by a potential difference between the second electrode 103 and the first counter electrode 105. For example, when there is no potential difference between the second electrode 103 and the first counter electrode 105, charges (holes) generated in the first photoelectric conversion film 104 near the second electrode 103 are not captured by the second electrode 103 and flow into the first electrode 102. As a result, these charges are read by the readout circuit 211 connected to the first electrode 102 and contribute to the sensitivity of the first pixel cell 100. In other words, this means that the area of an effective sensitivity region of the first pixel cell 100 becomes larger. Here, the "effective sensitivity region" means a virtual light-receiving region of a photoelectric conversion film which is one of the factors determining the sensitivity of a pixel cell.

On the other hand, when there is a potential difference between the second electrode 103 and the first counter electrode 105, charges generated in the first photoelectric conversion film 104 near the second electrode 103 move in a direction in which the charges are captured by the second electrode 103 and do not easily flow into the first electrode 102. As a result, these charges do not contribute to the sensitivity of the first pixel cell 100. In other words, this means that the area of the effective sensitivity region of the second pixel cell 101 becomes smaller.

As is the case with the first pixel cell (the high-sensitivity pixel cell) 100, the sensitivity of the second pixel cell (the low-sensitivity pixel cell) 101 varies by an electric field generated by a potential difference between the third electrode 106 and the second counter electrode 109 and an electric field generated by a potential difference between the fourth electrode 107 and the second counter electrode 109. As described above, the sensitivity of the first pixel cell 100 varies according to the voltage which is applied to the second electrode 103, and the sensitivity of the second pixel cell 101 varies according to the voltage which is applied to the fourth electrode 107.

Here, with reference to FIG. 3C, the advantage of a case in which the second electrode 103 is formed continuously in such a way as to surround the first electrode 102 and the fourth electrode 107 is formed continuously in such a way as to surround the third electrode 106, will be described along with the description of the effective sensitivity region.

Figure 3C:
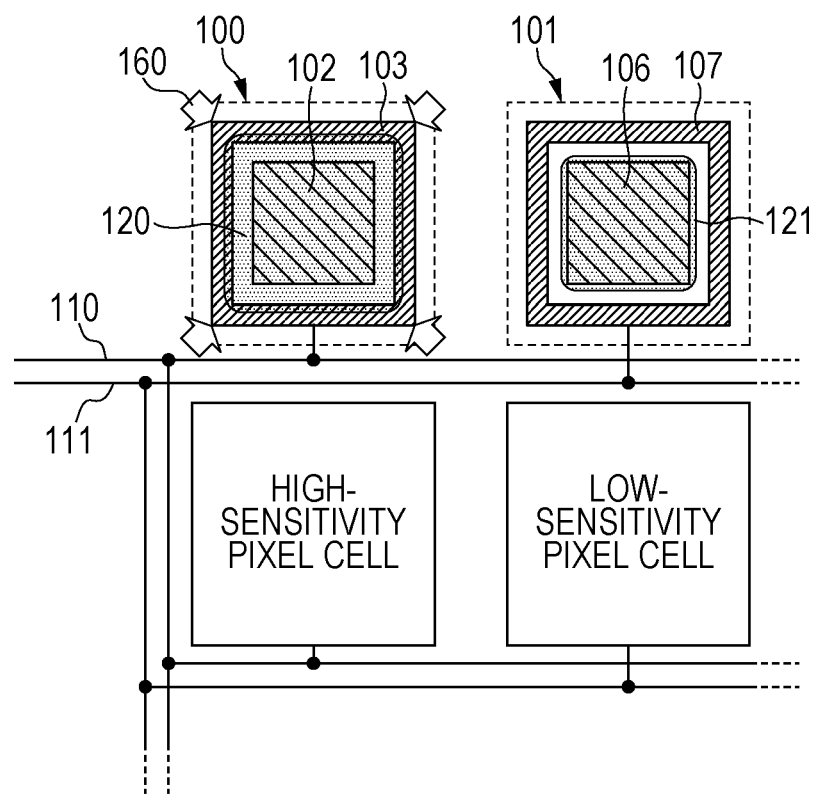
FIG. 3C is a diagram explaining the advantage of a case in which the second electrode is formed continuously in such a way as to surround the first electrode and the fourth electrode is formed continuously in such a way as to surround the third electrode.

In FIG. 3C, an effective sensitivity region 120 of the first pixel cell 100, an effective sensitivity region 121 of the second pixel cell 101, and leakage charges 160 from the adjacent pixel cells are depicted.

By forming the second electrode 103 continuously in such a way as to surround the first electrode 102 and forming the fourth electrode 107 continuously in such a way as to surround the third electrode 106, the leakage charges 160 are captured by the second electrode 103 and the fourth electrode 107. As a result, since the leakage charges 160 do not flow into the effective sensitivity region 120, color mixing and a reduction in resolution can be effectively suppressed.

As described above, in order to suppress color mixing and a reduction in resolution, it is preferable to form the second electrode 103 in such a way as to surround the first electrode 102 continuously and form the fourth electrode 107 in such a way as to surround the third electrode 106 continuously.

Figure 5:
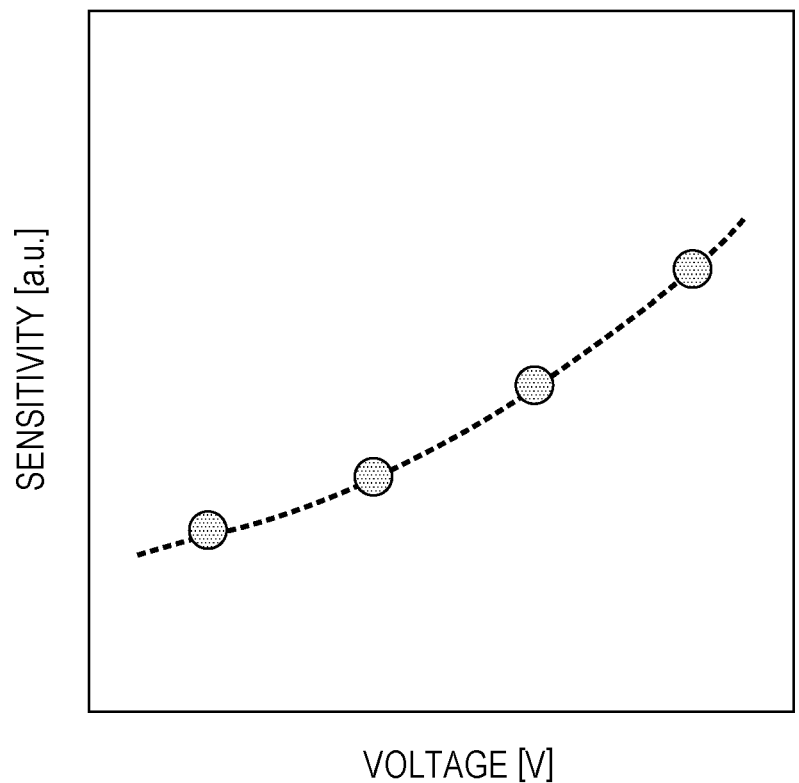
FIG. 5 is a graph schematically indicating the relationship between a voltage which is applied to the second electrode and the fourth electrode and a sensitivity output.

FIG. 5 schematically indicates the relationship between the voltage which is applied to the second electrode 103 and the fourth electrode 107, and the sensitivity. The sensitivity is substantially proportional to the area of the effective sensitivity region. When the detected charge is a hole, when the voltage which is applied to the second electrode 103 and the fourth electrode 107 is varied, the sensitivity also varies, and, when the voltage is raised, the sensitivity is increased. For example, when a relatively high voltage is applied to the second electrode 103, the sensitivity of the first pixel cell 100 is increased. Moreover, if a relatively low voltage is applied to the second electrode 103, the sensitivity of the second pixel cell 101 is reduced.

Such variations in sensitivity are described in more detail in Japanese Patent Application No. 2014-216209 which is an undisclosed patent application filed by the present inventor, the entire contents of which are incorporated herein by reference.

According to this embodiment, since the second electrode 103 and the fourth electrode 107 are electrically separated from each other, it is possible to apply a voltage to these electrodes independently. This makes it possible to vary the sensitivity of the first pixel cell (the high-sensitivity pixel cell) 100 and the sensitivity of the second pixel cell (the low-sensitivity pixel cell) 101 independently. Moreover, by optimizing each sensitivity, it is possible to expand the dynamic range.

Hereinafter, a modified example of this embodiment will be described.

Figure 6A:
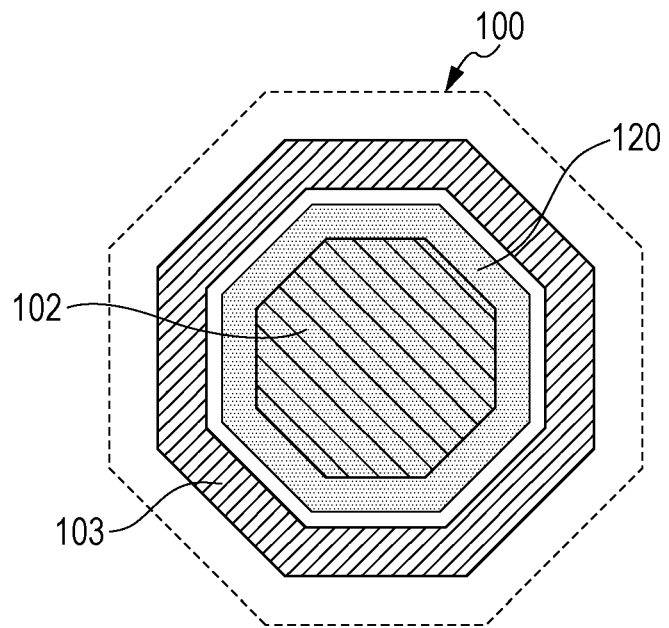
FIG. 6A is a schematic diagram depicting a layout example of the first electrode and the second electrode in the first pixel cell.
Figure 6B:
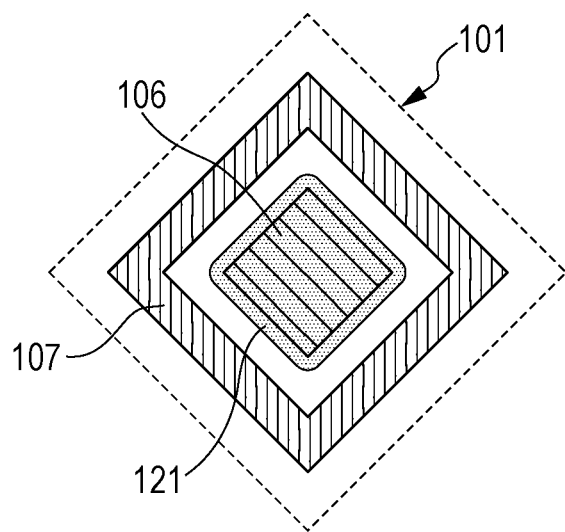
FIG. 6B is a schematic diagram depicting a layout example of the third electrode and the fourth electrode in the second pixel cell.
Figure 6C:
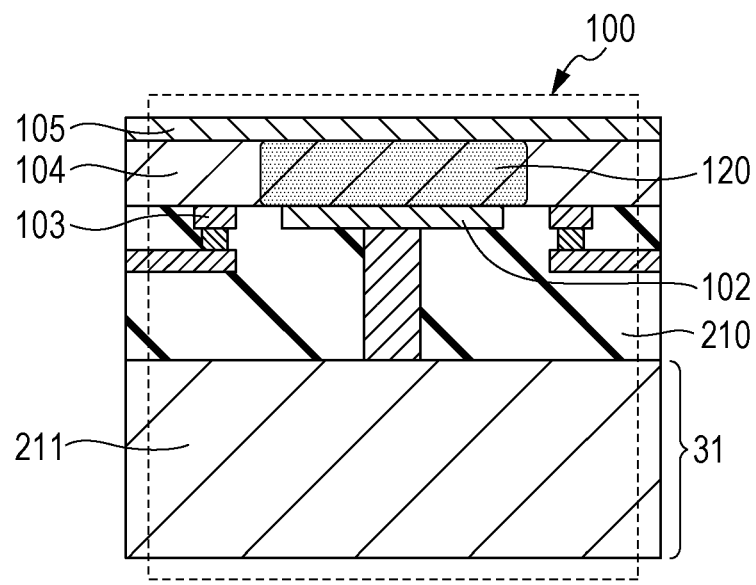
FIG. 6C is a schematic sectional view of the device structure of the first pixel cell.
Figure 6D:
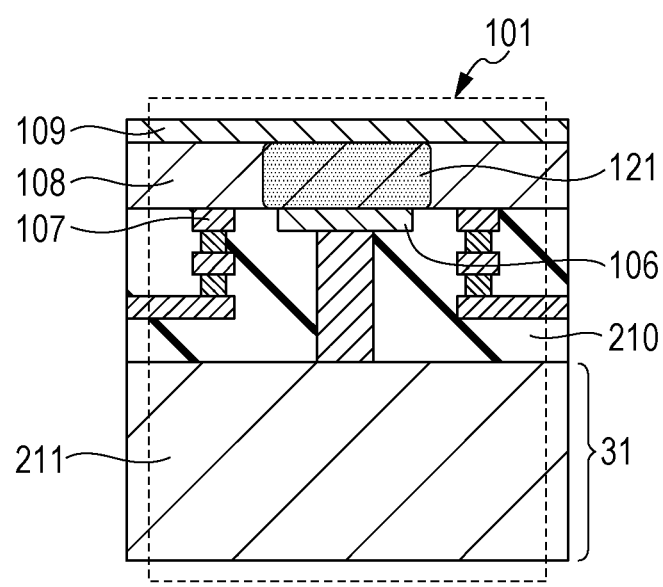
FIG. 6D is a schematic sectional view of the device structure of the second pixel cell.

FIG. 6A schematically depicts another layout example of the first electrode 102 and the second electrode 103 in the first pixel cell 100. FIG. 6B schematically depicts another layout example of the third electrode 106 and the fourth electrode 107 in the second pixel cell 101. Moreover, FIG. 6C is a schematic sectional view of the device structure of the first pixel cell 100. FIG. 6D is a schematic sectional view of the device structure of the second pixel cell 101.

The shape of the first electrode 102 of the present disclosure is not limited to a rectangular shape; for example, the first electrode 102 may be circular or polygonal in shape. In FIGS. 6A and 6B, an example in which the first electrode 102 is octagonal in shape and the third electrode 106 is rectangular in shape is depicted. Moreover, in order to increase the sensitivity of the first pixel cell 100, the area of the first electrode 102 may be made larger than the area of the third electrode 106. The sensitivity is substantially proportional to the area of a pixel electrode. Therefore, by making the area of the first electrode 102 larger than the area of the third electrode 106, the effective sensitivity region 120 of the first pixel cell 100 becomes larger than the effective sensitivity region 121 of the second pixel cell 101. As a result, the sensitivity of the first pixel cell 100 becomes higher than the sensitivity of the second pixel cell 101.

FIG. 7 schematically depicts a layout example of the first pixel cells 100 and the second pixel cells 101 having the shapes depicted in FIGS. 6A to 6D in the imaging region 200. The size of each first pixel cell 100 is larger than the size of each second pixel cell 101. Unlike the layout depicted in FIG. 1, with respect to the plurality of first pixel cells 100 arranged in each odd-numbered column, the plurality of second pixel cells 101 arranged in each even-numbered column adjacent to the odd-numbered column are shifted by ½ pixel in a column direction.

With this layout, it is possible to dispose a plurality of pixels densely in the imaging region 200 while increasing the sensitivity of the first pixel cell 100. This enhances the pixel layout efficiency.

Figure 8A:
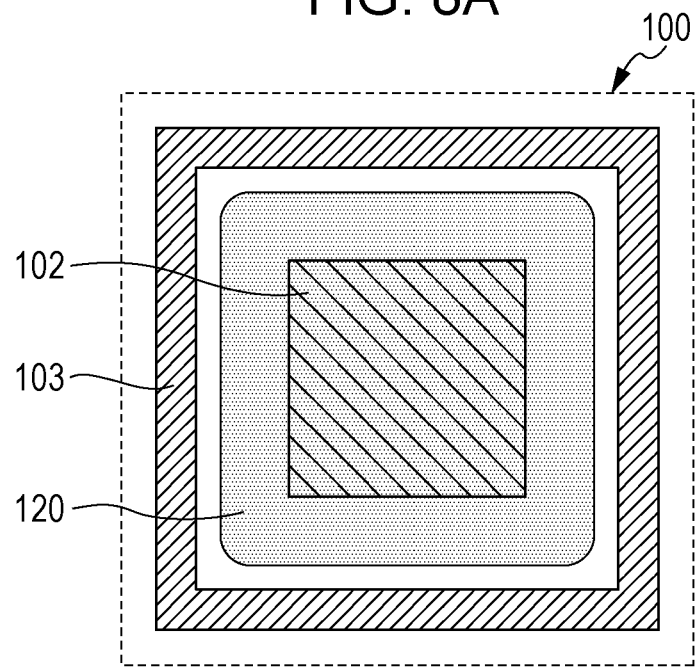
FIG. 8A is a schematic diagram depicting a layout example of the first electrode and the second electrode in the first pixel cell.
Figure 8B:
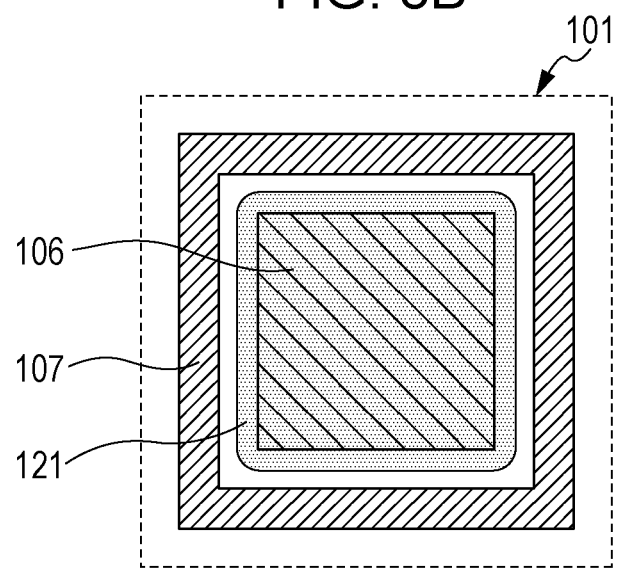
FIG. 8B is a schematic diagram depicting a layout example of the third electrode and the fourth electrode in the second pixel cell.
Figure 8C:
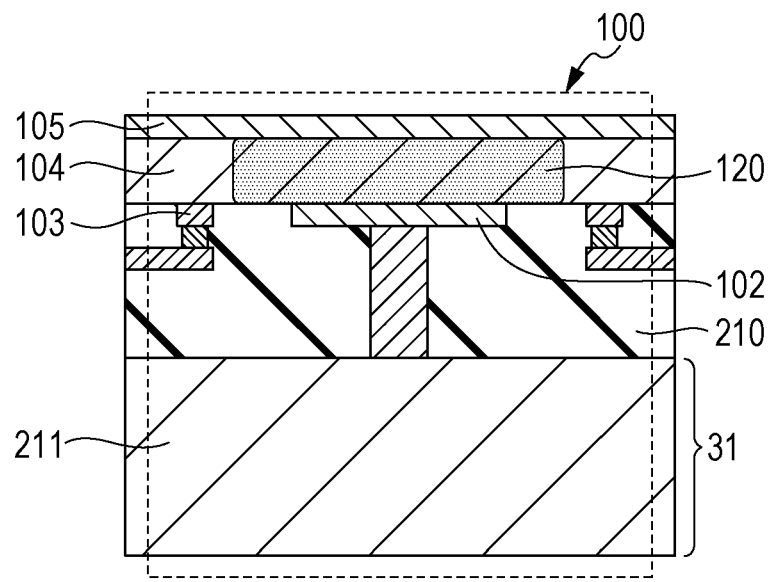
FIG. 8C is a schematic sectional view of the device structure of the first pixel cell.
Figure 8D:
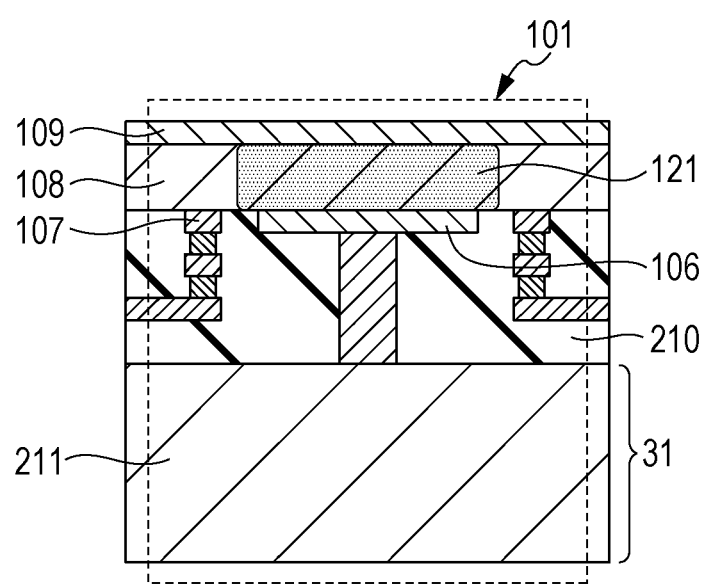
FIG. 8D is a schematic sectional view of the device structure of the second pixel cell.

FIG. 8A schematically depicts another layout example of the first electrode 102 and the second electrode 103 in the first pixel cell 100. FIG. 8B schematically depicts another layout example of the third electrode 106 and the fourth electrode 107 in the second pixel cell 101. Moreover, FIG. 8C is a schematic sectional view of the device structure of the first pixel cell 100, and FIG. 8D is a schematic sectional view of the device structure of the second pixel cell 101. FIG. 9 depicts a layout example of the first pixel cells 100 depicted in FIG. 8A and the second pixel cells 101 depicted in FIG. 8B in the imaging region 200.

The gap between the first electrode 102 and the second electrode 103 in the first pixel cell 100 is greater than the gap between the third electrode 106 and the fourth electrode 107 in the second pixel cell 101. That is, the shortest distance between the first electrode 102 and the second electrode 103 is greater than the shortest distance between the third electrode 106 and the fourth electrode 107. With this configuration, it is possible to broaden the range of the effective sensitivity region in the first pixel cell 100, which can be adjusted by a voltage to be applied. As a result, it is possible to make the area of the effective sensitivity region 120 of the first pixel cell 100 larger than the area of the effective sensitivity region 121 of the second pixel cell 101 and increase the sensitivity of the first pixel cell 100.

Figure 10A:
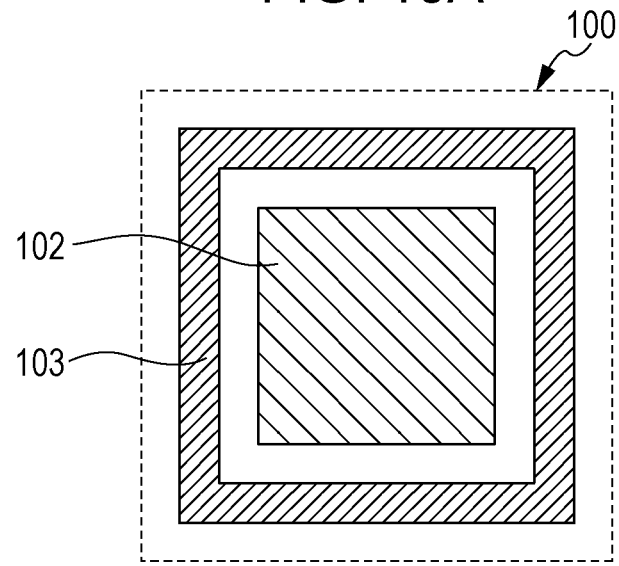
FIG. 10A is a schematic diagram depicting a layout example of the first electrode and the second electrode in the first pixel cell including a first color filter.
Figure 10B:
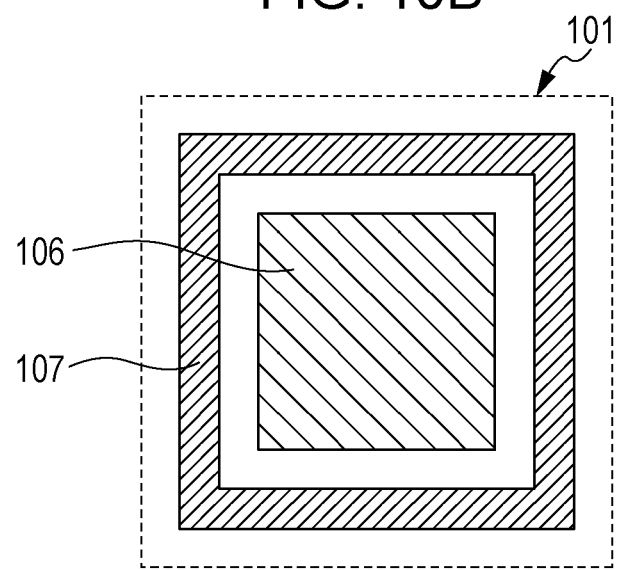
FIG. 10B is a schematic diagram depicting a layout example of the third electrode and the fourth electrode in the second pixel cell including a second color filter.
Figure 10C:
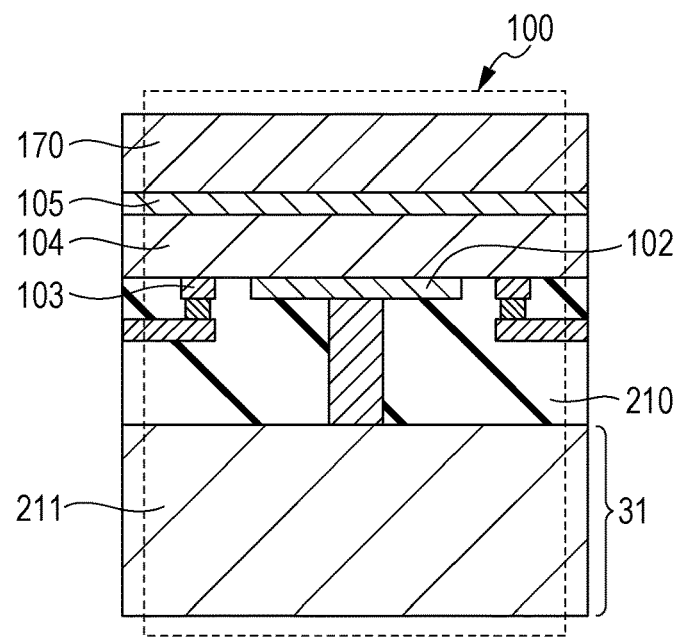
FIG. 10C is a schematic sectional view of the device structure of the first pixel cell including the first color filter.
Figure 10D:
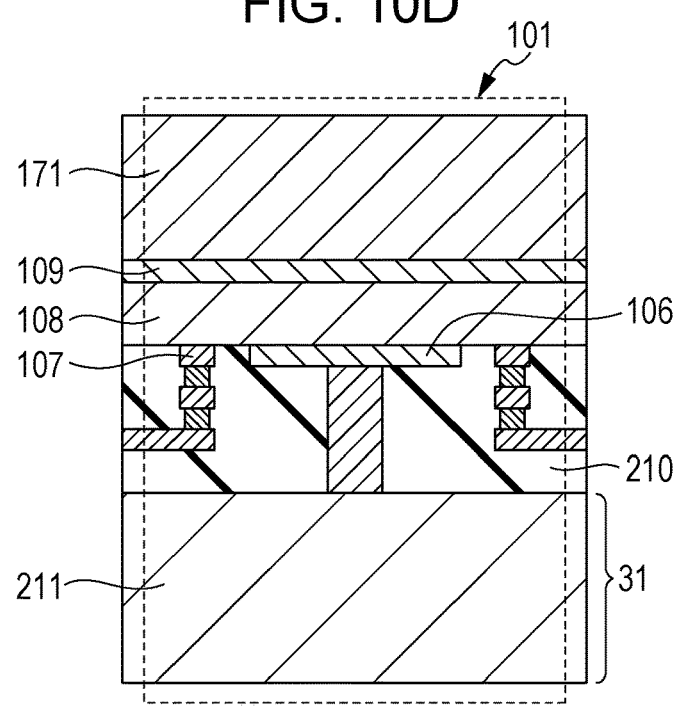
FIG. 10D is a schematic sectional view of the device structure of the second pixel cell including the second color filter.

FIG. 10A schematically depicts a layout example of the first electrode 102 and the second electrode 103 in the first pixel cell 100 including a first color filter 170. FIG. 10B schematically depicts a layout example of the third electrode 106 and the fourth electrode 107 in the second pixel cell 101 including a second color filter 171. Moreover, FIG. 10C is a schematic sectional view of the device structure of the first pixel cell 100 including the first color filter 170. FIG. 10D is a schematic sectional view of the device structure of the second pixel cell 101 including the second color filter 171.

The first pixel cell 100 has the first color filter 170 on the first counter electrode 105. The second pixel cell 101 has the second color filter 171 on the second counter electrode 109. For example, the first color filter 170 is red and the second color filter 171 is blue.

Assuming that the amount of light entering the first photoelectric conversion film 104 after passing through the first color filter 170 in the first pixel cell 100 is very large, charges generated in the first pixel cell (that is, the high-sensitivity pixel cell) 100 become saturated according to the amount of light. Also under such a shooting condition, by dynamically decreasing the voltage which is applied to the second electrode 103, the sensitivity of the first pixel cell 100 is reduced, and saturation of the charges generated in the first pixel cell 100 is suppressed.

Moreover, the present disclosure can also be applied to a pixel for phase difference AF (hereinafter referred to as a "phase difference pixel"). As a method of auto focus (AF), phase difference AF is known. This is a method in which focusing is obtained based on a phase difference between two parallax images. In this method, for example, a CMOS sensor including a phase difference pixel is used.

Figure 11A:
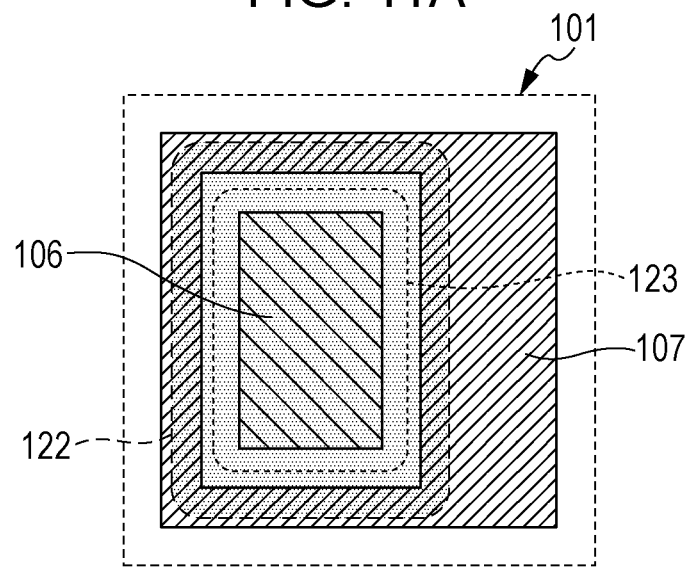
FIG. 11A is a schematic diagram depicting a layout example of the third electrode and the fourth electrode in the second pixel cell (a low-sensitivity pixel) in which a pixel electrode is provided on the left side.
Figure 11B:
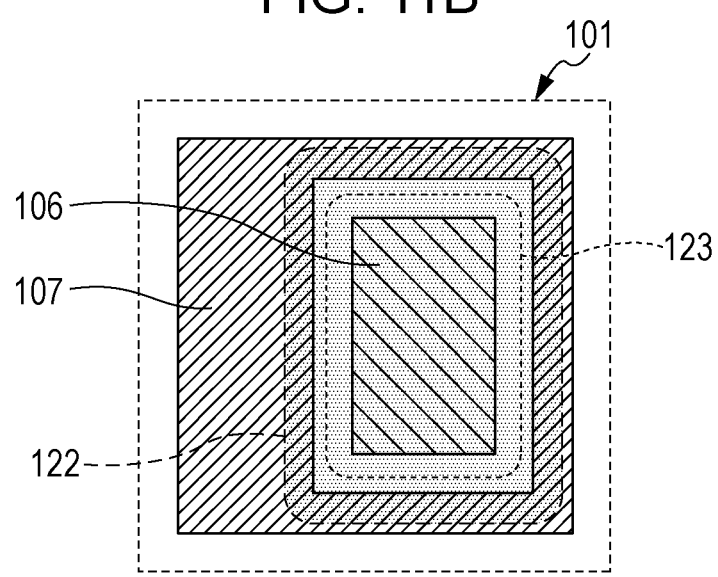
FIG. 11B is a schematic diagram depicting a layout example of the third electrode and the fourth electrode in the second pixel cell in which the pixel electrode is provided on the right side.
Figure 11C:
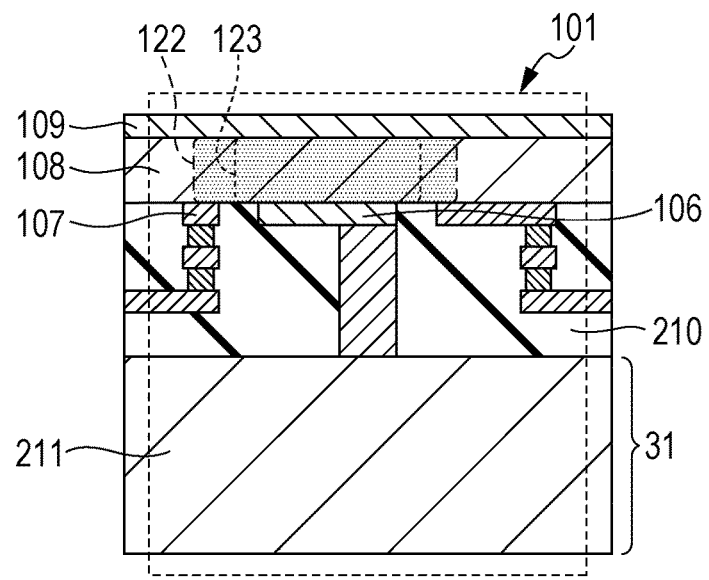
FIG. 11C is a schematic sectional view of the device structure of the second pixel cell in which the pixel electrode is provided on the left side.
Figure 11D:
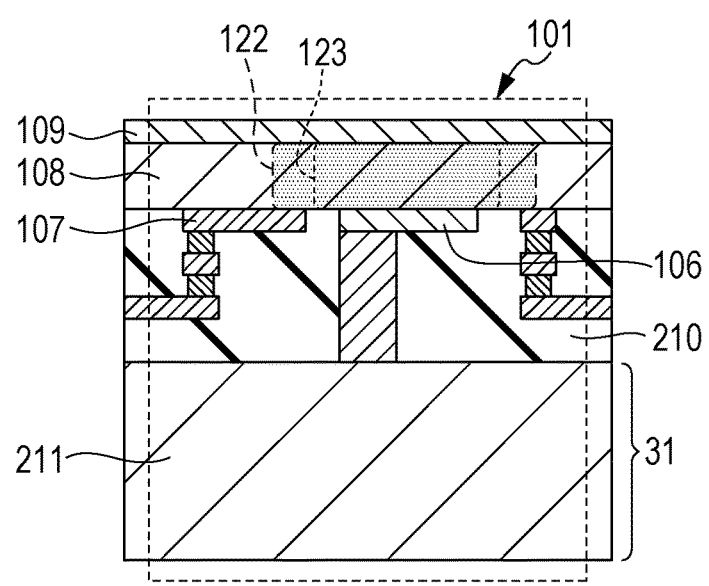
FIG. 11D is a schematic sectional view of the device structure of the second pixel cell in which the pixel electrode is provided on the right side.

FIG. 11A schematically depicts a layout example of the third electrode 106 and the fourth electrode 107 in the second pixel cell (the low-sensitivity pixel) 101 in which the pixel electrode is provided on the left side. FIG. 11B schematically depicts a layout example of the third electrode 106 and the fourth electrode 107 in the second pixel cell 101 in which the pixel electrode is provided on the right side. Moreover, FIG. 11C is a schematic sectional view of the device structure of the second pixel cell 101 in which the pixel electrode is provided on the left side. FIG. 11D is a schematic sectional view of the device structure of the second pixel cell 101 in which the pixel electrode is provided on the right side. FIG. 12 indicates switching timing of an applied voltage at the time of phase difference detection.

In this example, the second pixel cell 101 has the phase difference detection function. In other words, all or some of the plurality of second pixel cells 101 are phase difference pixels. It is noted that the first pixel cell (the high-sensitivity pixel) 100 may have the phase difference detection function.

When an imaging mode is switched from a phase difference detection mode to a phase difference non-detection mode, the voltage which is applied to the fourth electrode 107 is switched. Specifically, when phase difference detection is not performed (when the phase difference non-detection mode is selected), by applying a relatively high voltage to the fourth electrode 107, the effective sensitivity region at the time of phase difference non-detection becomes larger and the sensitivity is increased. On the other hand, at the time of phase difference detection (when the phase difference detection mode is selected), by applying a relatively low voltage to the fourth electrode 107, the effective sensitivity region at the time of phase difference detection becomes smaller. In each of FIGS. 11A to 11D, the effective sensitivity region 122 at the time of phase difference non-detection and the effective sensitivity region 123 at the time of phase difference detection are depicted.

With this configuration, at the time of phase difference non-detection, it is possible to suppress a deterioration in the image quality with a reduction in the sensitivity of the phase difference pixel.

Second Embodiment

An imaging device 2 according to a second embodiment differs from the imaging device 1 according to the first embodiment in that the imaging device 2 includes a voltage applying circuit 130. Since the configuration other than the voltage applying circuit 130 is the same as the configuration of the first embodiment, the voltage applying circuit 130 will be mainly described.

Figure 13:
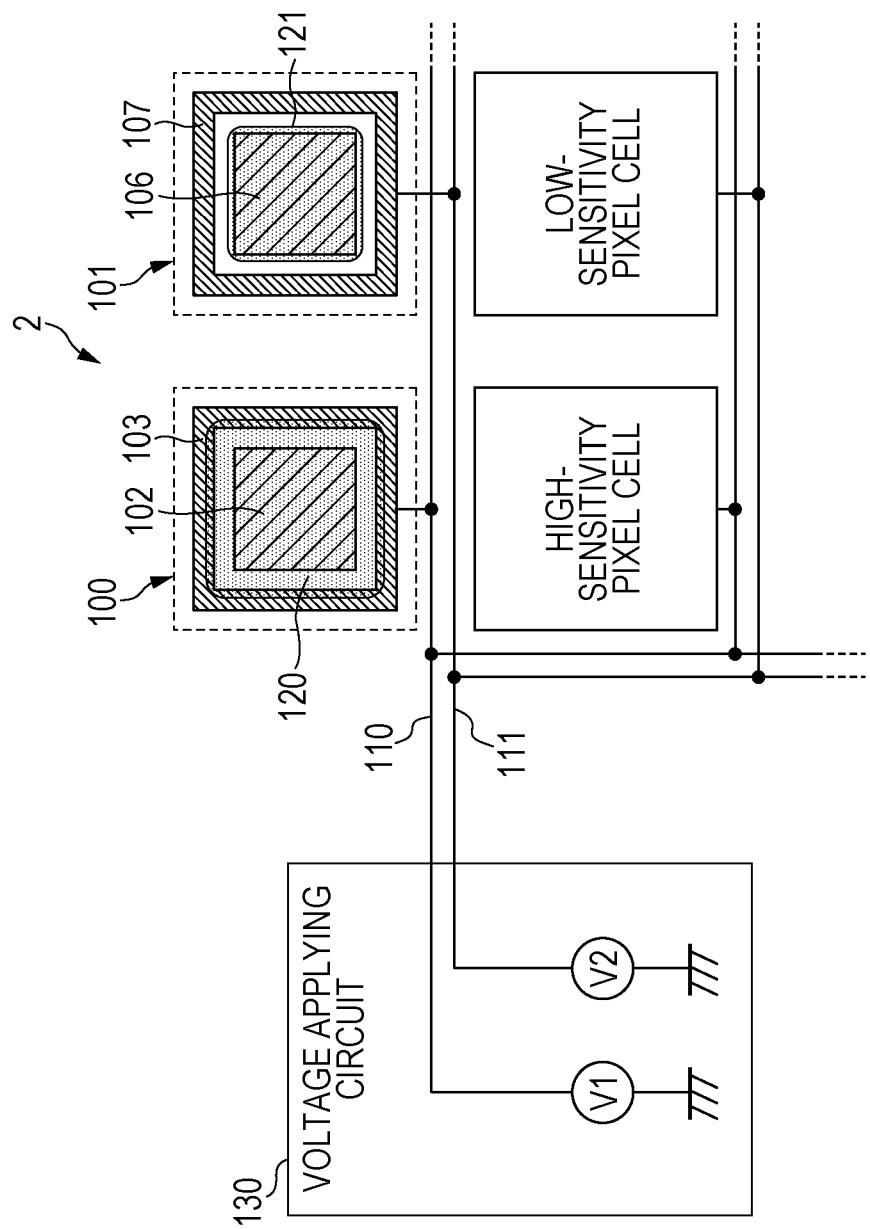
FIG. 13 is a schematic diagram depicting the electrical connection relationship between the second electrode of the first pixel cell and the fourth electrode of the second pixel cell and a voltage applying circuit.
Figure 14:
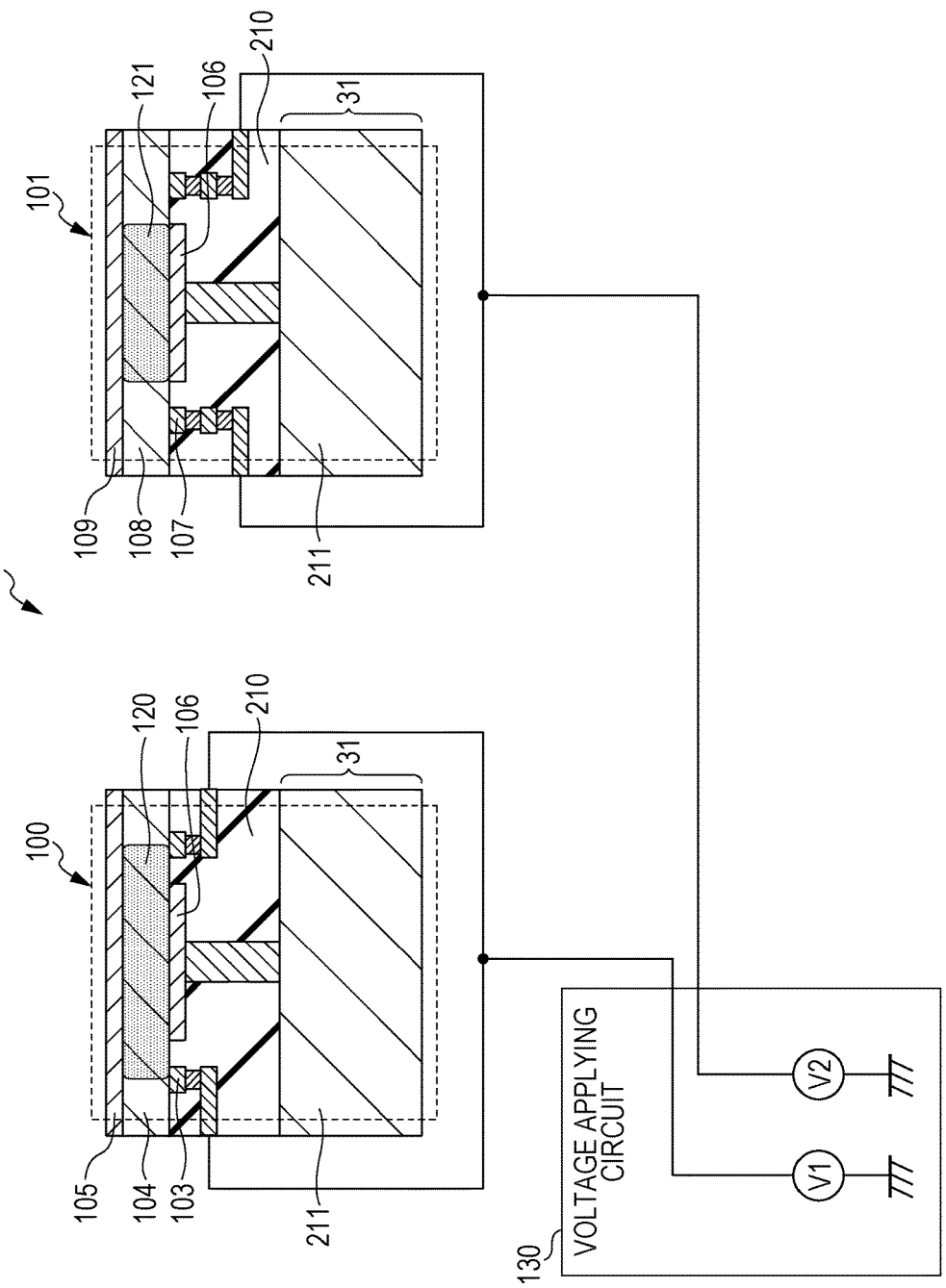
FIG. 14 is a schematic sectional view of each of the first pixel cell and the second pixel cell.

FIG. 13 schematically depicts the electrical connection relationship between the second electrode 103 of the first pixel cell 100 and the fourth electrode 107 of the second pixel cell 101 and the voltage applying circuit 130. FIG. 14 schematically depicts a cross section of each of the first pixel cell 100 and the second pixel cell 101.

The voltage applying circuit 130 can generate a predetermined voltage and apply the voltage to the plurality of first pixel cells 100 and the plurality of second pixel cells 101 independently. The predetermined voltage is determined as appropriate based on, for example, an instruction from an operator who operates the imaging device 1 or an instruction from the controller 202 (see FIG. 1) in the imaging device 1.

The voltage applying circuit 130 typically applies the voltage to the plurality of first pixel cells 100 and the plurality of second pixel cells 101 independently. Alternatively, the voltage applying circuit 130 may apply the voltage independently on a row-by-row basis or on a column-by-column basis, for example. Moreover, since the second electrode 103 and the fourth electrode 107 are electrically separated from each other, the voltage applying circuit 130 may apply the voltage separately on a pixel cell-by-pixel cell basis or may group a plurality of pixel cells and apply the voltage independently on a group-by-group basis.

With such a configuration, it is possible to apply the voltage to the second electrode 103 and the fourth electrode 107 independently. Furthermore, since there is no need to connect an external voltage applying circuit to the imaging device 2, it is possible to reduce the size of an imaging module itself.

In this embodiment, the voltage applying circuit 130 applies a voltage V1 to the plurality of second electrodes 103 via the wire 110 and applies a voltage V2 to the plurality of fourth electrodes 107 via the wire 111. The applied voltage V1 is greater than the applied voltage V2. As a result, the area of the effective sensitivity region 120 of the first pixel cell 100 becomes greater than the area of the effective sensitivity region 121 of the second pixel cell 101, which makes it possible to relatively increase the sensitivity of the first pixel cell 100. That is, it is possible to control the area of the effective sensitivity region by the applied voltage. By applying this, it is possible to vary dynamically the applied voltages V1 and V2 in accordance with the illumination at the time of shooting, for example.

Figure 15:
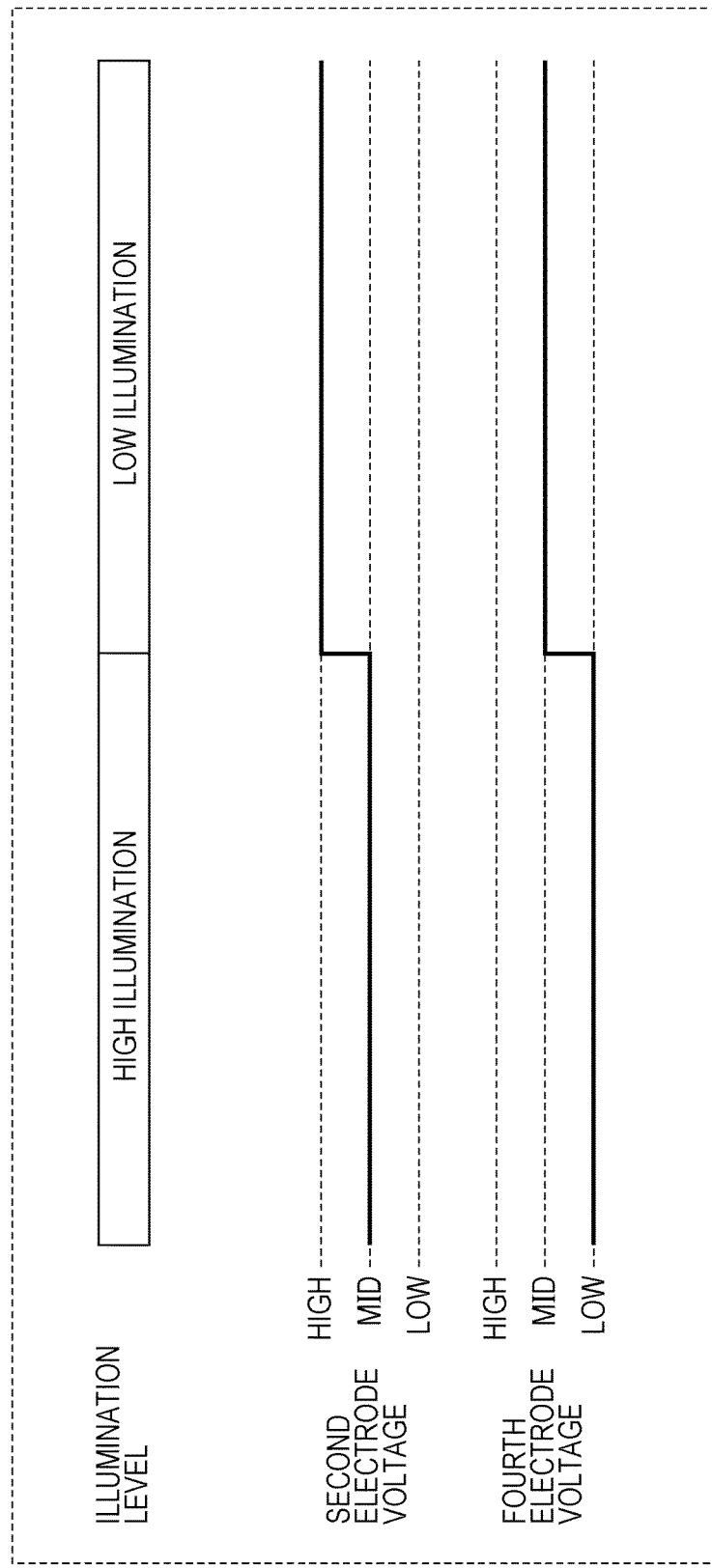
FIG. 15 is a diagram indicating timing with which each of the applied voltages is switched in accordance with an illumination level.

FIG. 15 indicates timing with which each of the applied voltages V1 and V2 is switched in accordance with the illumination at the time of shooting. For example, when the illumination is relatively high, by setting the applied voltage V1 at an intermediate level between "Low" level and "High" level and setting the applied voltage V2 at "Low" level, it is possible to reduce the sensitivity and suppress saturation. On the other hand, when the illumination is relatively low to the extent that does not cause pixel saturation, by setting the applied voltage V1 at "High" level and setting the applied voltage V2 at an intermediate level, it is possible to increase the sensitivity.

According to this embodiment, by controlling the area of the effective sensitivity region in accordance with the illumination at the time of shooting, it is possible to vary the sensitivity dynamically. Moreover, by optimizing each sensitivity in accordance with a scene to be shot, it is possible to expand the dynamic range.

Third Embodiment

Figure 16:
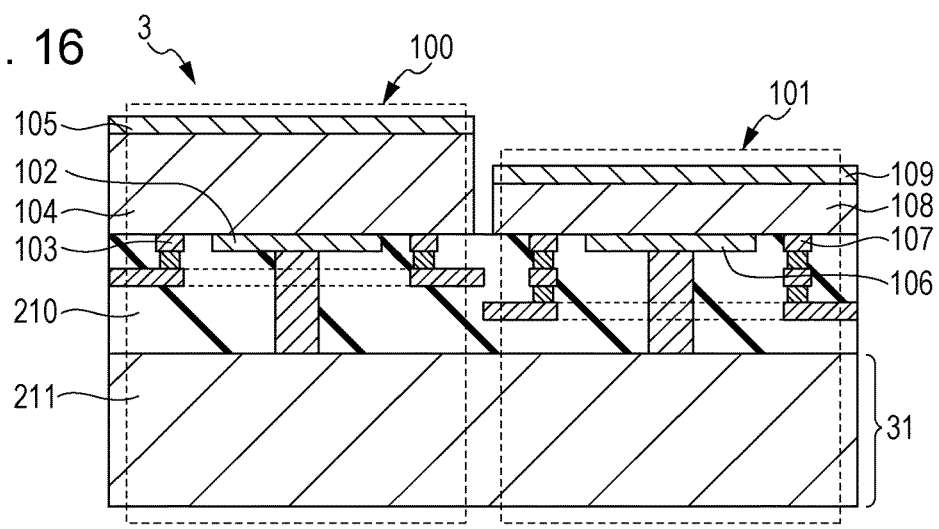
FIG. 16 is a schematic sectional view of the first pixel cell and the second pixel cell which are adjacent to each other.
Figure 17:
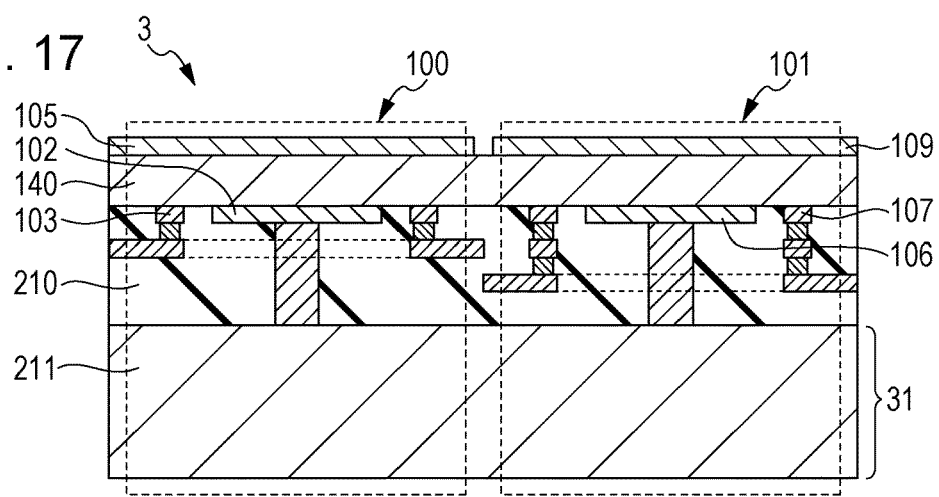
FIG. 17 is a schematic sectional view of the first pixel cell and the second pixel cell which are adjacent to each other.
Figure 18:
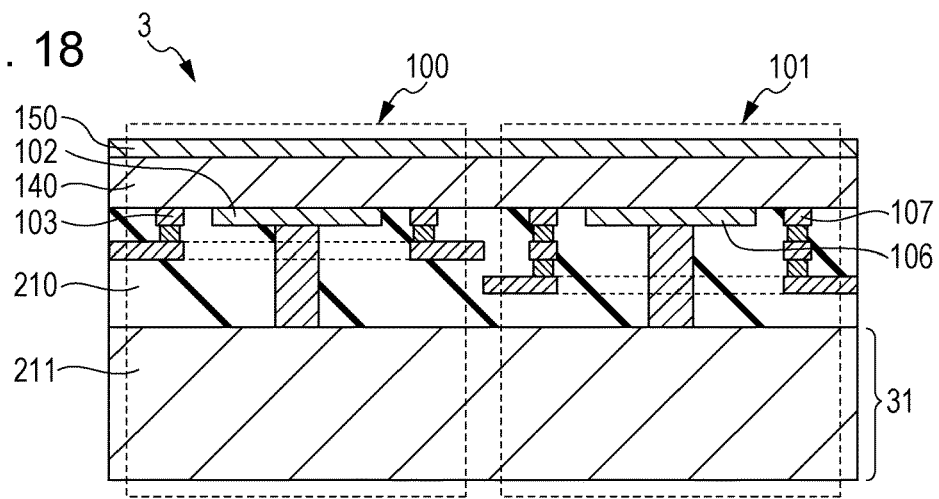
FIG. 18 is a schematic sectional view of the first pixel cell and the second pixel cell which are adjacent to each other.

With reference to FIGS. 16 to 18, an imaging device 3 according to a third embodiment will be described.

FIG. 16 schematically depicts a cross section of the first pixel cell 100 and the second pixel cell 101 which are adjacent to each other. As depicted in FIG. 16, the first electrode 102, the second electrode 103, the third electrode 106, and the fourth electrode 107 are formed on the same plane. This makes it possible to form these electrodes all together and therefore simplify the process and reduce production costs.

FIG. 17 schematically depicts a cross section of the first pixel cell 100 and the second pixel cell 101 which are adjacent to each other. As depicted in FIG. 17, the first photoelectric conversion film and the second photoelectric conversion film are integrally formed in such a way as to be in contact with the first electrode 102, the second electrode 103, the third electrode 106, and the fourth electrode 107. That is, a common photoelectric conversion film 140 is formed continuously in the first pixel cell 100 and the second pixel cell 101. In other words, the first photoelectric conversion film and the second photoelectric conversion film are formed as a single film. In this structure, since the photoelectric conversion films can be formed all together, it is possible to simplify the process and reduce production costs.

FIG. 18 schematically depicts a cross section of the first pixel cell 100 and the second pixel cell 101 which are adjacent to each other. As depicted in FIG. 18, the first counter electrode and the second counter electrode are integrally formed. That is, a common counter electrode 150 is formed continuously on the first photoelectric conversion film 104 and the second photoelectric conversion film 108. In other words, the first counter electrode and the second counter electrode are formed as a single electrode. As a result, since the counter electrodes can be formed all together, it is possible to simplify the process and reduce production costs.

It is noted that the device structures depicted in FIGS. 16 to 18 may be arbitrarily combined.

Fourth Embodiment

Figure 19:
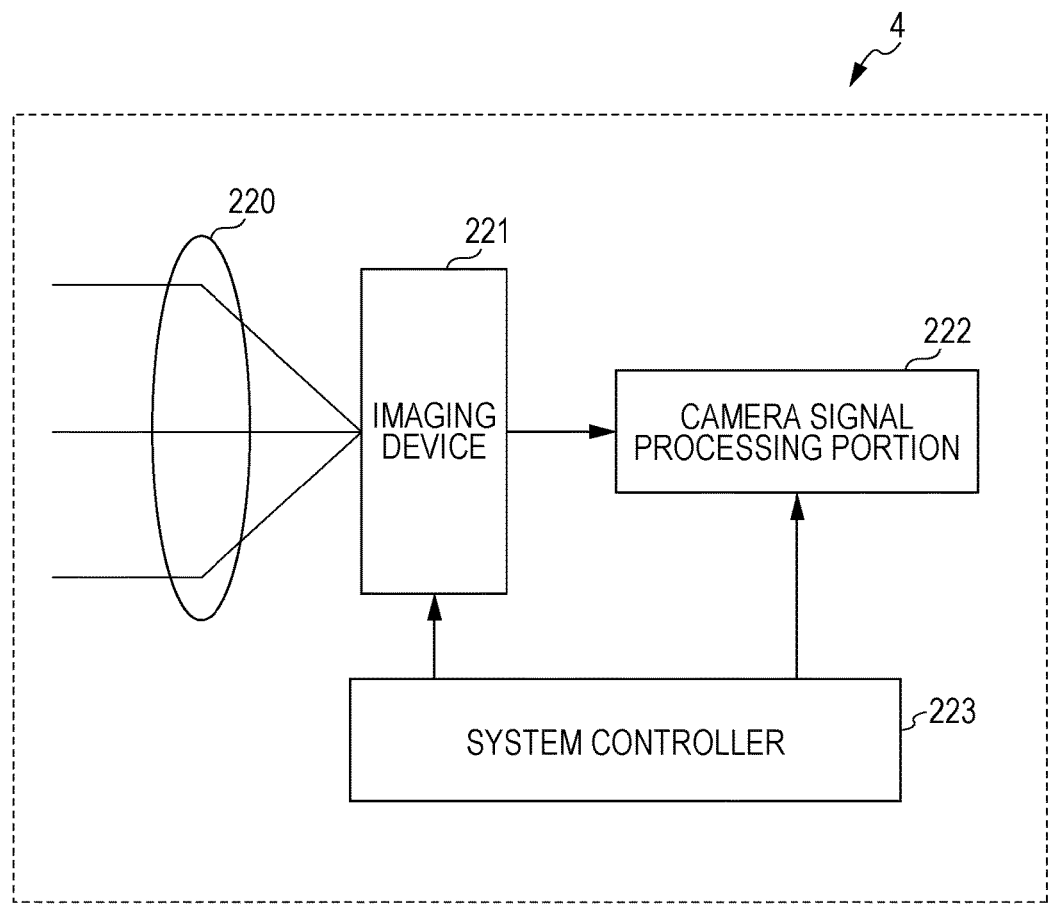
FIG. 19 is a diagram schematically depicting a configuration example of an imaging module.

With reference to FIG. 19, an imaging module 4 according to a fourth embodiment will be described.

FIG. 19 schematically depicts a configuration example of the imaging module 4. The imaging module 4 includes an optical system 220 including a lens and a diaphragm, an imaging device 221, a camera signal processing portion 222, and a system controller 223. These components are typically mounted on a printed board.

As the imaging device 221, the imaging devices 1 to 3 according to the first to third embodiments can be used.

The camera signal processing portion 222 is formed of, for example, a semiconductor element. The camera signal processing portion 222 can be implemented by an image signal processor (ISP), for example. The camera signal processing portion 222 processes an image signal which is output from the imaging device 221 and generates image data.

The system controller 223 is implemented by, for example, a central processing unit (CPU) expressly meant for a module. The system controller 223 controls the imaging module 4 entirely.

According to this embodiment, by suppressing saturation of low-sensitivity pixels, it is possible to provide an imaging module that is capable of wide dynamic range shooting.

The imaging device and the imaging module according to the present disclosure can be used in various camera systems and sensor systems such as a digital still camera, a medical camera, a monitoring camera, a vehicle-mounted camera, a digital single-lens reflex camera, and a digital mirrorless interchangeable lens camera.

What is claimed is:

1. An imaging device comprising:
   first pixels, each first pixel including
      a first photoelectric conversion film having a first surface and a second surface opposite to the first surface,
      a first electrode on the first surface,
      a second electrode on the first surface, surrounding the first electrode, and
      a first counter electrode on the second surface, facing the first electrode and the second electrode; and
   second pixels, each second pixel including
      a second photoelectric conversion film having a third surface and a fourth surface opposite to the third surface,
      a third electrode on the third surface,
      a fourth electrode on the third surface, surrounding the third electrode, and
      a second counter electrode on the fourth surface, facing the third electrode and the fourth electrode, wherein
   the second electrodes of the first pixels are electrically separated from the fourth electrodes of the second pixels,
   the second electrodes of the first pixels are electrically coupled to each other, and
   the fourth electrodes of the second pixels are electrically coupled to each other.

2. The imaging device according to claim 1, wherein an area of the first electrode of each first pixel is larger than an area of the third electrode of each second pixel.

3. The imaging device according to claim 1, wherein a shortest distance between the first electrode and the second electrode of each first pixel is greater than a shortest distance between the third electrode and the fourth electrode of each second pixel.

4. The imaging device according to claim 1, further comprising a voltage supplying circuit, applying respective voltages to the second electrodes and the fourth electrodes independently.

5. The imaging device according to claim 4, wherein
   the voltage supplying circuit applies a first voltage to the second electrodes, and
   the voltage supplying circuit applies a second voltage different from the first voltage, to the fourth electrodes.

6. The imaging device according to claim 1, wherein the first electrodes, the second electrodes, the third electrodes, and the fourth electrodes are arranged on a same plane.

7. The imaging device according to claim 1, wherein the first photoelectric conversion films and the second photoelectric conversion films constitute a single film.

8. The imaging device according to claim 1, wherein the first counter electrodes and the second counter electrodes constitute a single electrode.

9. The imaging device according to claim 1, wherein
   in a plan view, the second electrodes have first openings in which the first electrodes are respectively located, and in a plan view, the fourth electrodes have second openings in which the third electrodes are respectively located.

10. The imaging device according to claim 1, wherein
the second electrodes have a function different from a function of the first electrodes, and
the fourth electrodes have a function different from a function of the third electrodes.

11. The imaging device according to claim 1, wherein a sensitivity of the first pixels is higher than a sensitivity of the second pixels.

12. The imaging device according to claim 1, wherein
one of the first pixels is directly adjacent to one of the second pixels,
the one of the first pixels includes a first color filter covering the first electrode and the first counter electrode, and
the one of the second pixels includes a second color filter covering the third electrode and the second counter electrode, a color of the second color filter being different from a color of the first color filter.

13. The imaging device according to claim 1, wherein
the first photoelectric conversion film generates a first hole through photoelectric conversion,
each first pixel includes a first readout circuit connected to the first electrode and detects the first hole,
each second photoelectric conversion film generates a second hole through photoelectric conversion, and
each second pixel includes a second readout circuit connected to the third electrode and detects the second hole.

14. An imaging module comprising:
the imaging device according to claim 1, outputting a signal; and
a signal processor generating image data by processing the signal.

15. An imaging device comprising:
a first pixel including
a first photoelectric conversion film having a first surface and a second surface opposite to the first surface,
a first electrode on the first surface,
a second electrode on the first surface, surrounding the first electrode, and
a first counter electrode on the second surface, facing the first electrode and the second electrode; and
a second pixel including
a second photoelectric conversion film having a third surface and a fourth surface opposite to the third surface,
a third electrode on the third surface,
a fourth electrode on the third surface, surrounding the third electrode, and
a second counter electrode on the fourth surface, facing the third electrode and the fourth electrode, wherein
the second electrode and the fourth electrode are electrically separated from each other, and
a shortest distance between the first electrode and the second electrode is greater than a shortest distance between the third electrode and the fourth electrode.

16. An imaging device comprising:
a first pixel and a third pixel, each of the first pixel and the third pixel including
a first photoelectric conversion film having a first surface and a second surface opposite to the first surface,
a first electrode on the first surface,
a second electrode on the first surface, surrounding the first electrode, and
a first counter electrode on the second surface, facing the first electrode and the second electrode; and
a second pixel and a fourth pixel, each of the second pixel and the fourth pixel including
a second photoelectric conversion film having a third surface and a fourth surface opposite to the third surface,
a third electrode on the third surface,
a fourth electrode on the third surface, surrounding the third electrode, and
a second counter electrode on the fourth surface, facing the third electrode and the fourth electrode, wherein
the second electrodes of the first and third pixels are electrically separated from the fourth electrodes of the second and fourth pixels,
the second electrode of the first pixel is electrically coupled to the second electrode of the third pixel, and
the fourth electrode of the second pixel is electrically coupled to the fourth electrode of the fourth pixel.

* * * * *